United States Patent [19]
Noda et al.

[11] Patent Number: 5,841,190
[45] Date of Patent: Nov. 24, 1998

[54] HIGH DENSITY MULTI-LAYERED PRINTED WIRING BOARD, MULTI-CHIP CARRIER AND SEMICONDUCTOR PACKAGE

[75] Inventors: Kouta Noda; Tooru Inoue; Benzhen Yuan, all of Gifu-Ken, Japan

[73] Assignee: Ibiden Co., Ltd., Ogaki, Japan

[21] Appl. No.: 601,046

[22] PCT Filed: May 19, 1995

[86] PCT No.: PCT/JP95/00964

§ 371 Date: Feb. 23, 1996

§ 102(e) Date: Feb. 23, 1996

[51] Int. Cl.⁶ .............................. H01L 23/28; H01L 23/12

[52] U.S. Cl. ..................... 257/678; 257/668; 257/700; 257/693; 257/702; 257/680

[58] Field of Search ..................... 257/697, 693, 257/691, 698, 700–703, 680, 678, 668

[56] References Cited

U.S. PATENT DOCUMENTS

| | | | |
|---|---|---|---|
| 4,561,006 | 12/1985 | Currie | 257/697 |
| 4,598,308 | 7/1986 | James et al. | 257/702 |
| 4,617,730 | 10/1986 | Geldermans et al. | 257/697 |
| 4,667,220 | 5/1987 | Lee et al. | 257/697 |
| 5,102,829 | 4/1992 | Cohn | 257/697 |
| 5,177,670 | 1/1993 | Shinohara et al. | 257/697 |
| 5,450,290 | 9/1995 | Boyko et al. | 257/700 |
| 5,488,542 | 1/1996 | Ito | 257/700 |
| 5,515,241 | 5/1996 | Werther | 257/697 |
| 5,625,228 | 4/1997 | Rogren | 257/697 |
| 5,641,988 | 6/1997 | Huang et al. | 257/697 |

FOREIGN PATENT DOCUMENTS

| | | |
|---|---|---|
| 50-98274 | 8/1975 | Japan . |
| 6-13491 | 1/1994 | Japan . |

*Primary Examiner*—Tom Thomas
*Assistant Examiner*—Alexander Oscar Williams
*Attorney, Agent, or Firm*—Beyer & Weaver, LLP

[57] ABSTRACT

A semiconductor package (11) includes a high density multi-layered printed wiring board (12), a plurality of LSI chips (14,15) and a substrate supporter (13). A substrate (16) is made of a material having higher heat conductivity than that of resins. A build-up layer (17) having interlayer insulations (I1–I4) and conductive layers (C1–C5) is formed on a first side (S1) of the substrate (16). A die area (19) for mounting the LSI chips (14,15) is provided on the build-up layer (17). A plurality of I/O pads (21) are provided around the die area. The I/O pads (21) are connected to bonding pads (28) on the supporter (13) via bonding wires. The supporter (13) includes a printed wiring board (23) consisting essentially of a resin material. The wiring board (12) is fitted in a window (24) formed in the printed wiring board (23) while a second side (S2) of the substrate, which is opposite to the first side, is exposed from the window. Heat generated in the LSI chips (14,15) is efficiently released from the second side of the substrate (S2).

23 Claims, 22 Drawing Sheets

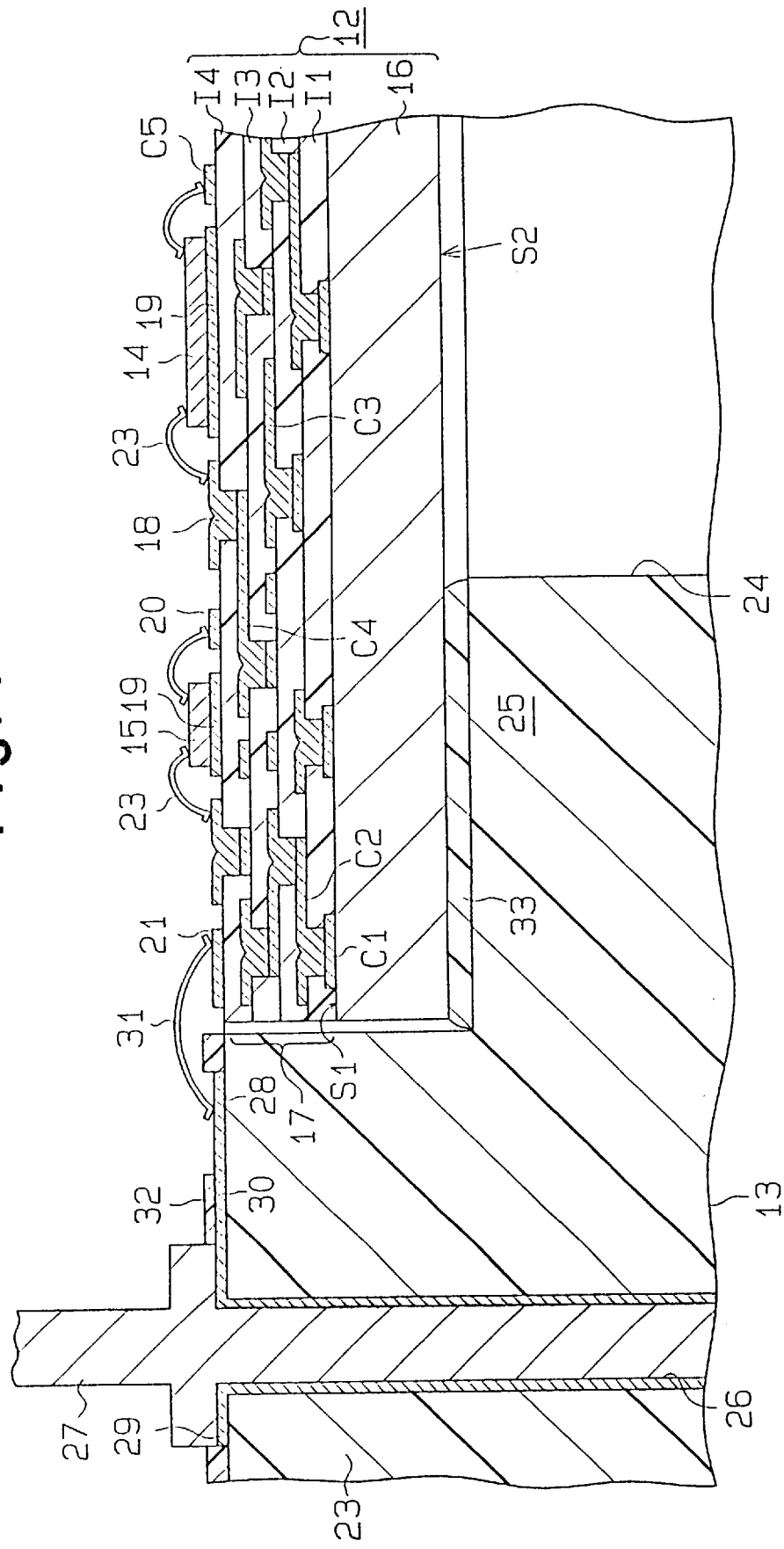

HIGH DENSITY MULTI-LAYERED PRINTED WIRING BOARD, MULTI-CHIP CARRIER AND SEMICONDUCTOR PACKAGE

TECHNICAL FIELD

The present invention relates generally to a high density multi-layered printed wiring board (ML-PWB), multi-chip carrier and semiconductor package.

BACKGROUND ART

Progress in the field of industrial electronics, typified by large-scale computer systems, has been accelerated in recent years. The main part of each device used in such computer system includes a large printed wiring board, called a "mother board", on which semiconductor packages and other electronic parts are mounted. A semiconductor package contains one or more bare semiconductor chips, and assists a semiconductor chip provided thereon to properly function. In order to develop high performance electronics, therefore, it is very important not only to improve the performance of semiconductor chips but also to improve the performance of whole packages of semiconductor devices.

A semiconductor package has several functions or roles. The first function is to establish electrical connections between semiconductor chips in a system. The semiconductor chips in a package should be supplied with power from an external power supply in order to operate. The power is provided to the semiconductor chips from a mother board via the package. Signal communications between the mother board and the semiconductor chips are also done via the package. The second function of a semiconductor package is to protect bare chips mounted thereon. Protecting semiconductor chips from external environments such as contaminants, light and shocks or impacts is required to maintain stable operations of electronic circuits for a long time. The third function of a semiconductor package is to dissipate heat from semiconductor chips thereon. This prevents the semiconductor chips from failing to normally function and from breaking down due to the overheating of the chips by the heat generated by power consumption of the circuits on the chips. The fourth function of a semiconductor package is to mount semiconductor chips on the package. Since semiconductor chips are too small in size to be handled, it is difficult to mount them directly on a mother board. It is therefore required to use a package enclosing semiconductor chips to facilitate the handling of the chips.

Plastic packages made of resin materials are currently used as packages for semiconductor chips. Plastic packages have the advantage of being made from inexpensive material, but have the disadvantage of a low heat dissipating efficiency. This advantage and disadvantage are derived from the fact that synthetic resin is used as the prime constituent of the package. In designing a plastic package it is therefore required that a heat dissipating structure be provided in order to avoid malfunctions and breakdowns of the chips mounted on the package. One remedy prescribed for the heat problem of plastic package is to provide heat slugs in a substrate of the package, to be diebonded with bare chip. Metal plates with high heat conductivity (e.g. Cu-W alloy plates) are often appropriate heat slugs.

FIG. 30 illustrates an example of conventional plastic packages provided with heat slugs. The package 151 shown in FIG. 30 is a pin grid array (PGA) which is a pin-insertion type semiconductor package. In the package 151, a plurality of semiconductor chips 153 are mounted on a substrate 152. Therefore, this type of package is often called multi chip module (MCM). The substrate 152 constituting the package 151 is made of synthetic resin, and has a plurality of through holes 154, each of which has a size substantially equal to the size of each chip. Heat slugs 155 are fitted into the holes 154. On the surface of the substrate 152, the chips 153 are diebonded with the heat slugs 155. The substrate 152 incorporates a plurality of I/O pins 156 as external connecting terminals provided in its peripheral portion. Each of the chips 153 is electrically connected to I/O pins 156 via bonding wires 157 and interconnection wirings 158. According to this structure, heat paths are provided from the chips 153 towards the heat slugs 155, so that the heat generated by the chips 153 is dissipated through the heat paths to the outside of the PGA 151. This prevents excessive rises in the temperature of each chip 153.

The conventional plastic package 151 however has the following disadvantage. Some designers of semiconductor packages often try to improve the heat dissipation by employing larger heat slugs for the purpose of increasing the heat dissipation areas of the slugs. This design also means enlarging dead areas to the point where the wires 158 are unable to be formed. In this case, therefore, it is required to enlarge the size of the package 151 itself in order to obtain sufficient areas for the wires 158. However, signal propagation speed is affected by prolonged length of the wires 158. As a result, the electric characteristics of a semiconductor device become worse. On the contrary, it is impossible to employ larger heat slugs without enlarging the size of the package. In short, improving the heat dissipation and downsizing the package 151 are difficult to accomplish at the same time. The above-mentioned remedy therefore is far from an effective one.

Another approach to improving heat dissipation is to replace the synthetic resin substrate 152 with a plate made of a material having higher heat conductivity than synthetic resins (e.g. Cu or Cu-W alloy plates or ceramic substrates). However, these materials are harder than synthetic resins. It is therefore difficult to form through holes in such metal or ceramic plates to produce a package with the same structure as shown in FIG. 30. It is also difficult to form fine wirings 158 on the surface of metal or ceramic plate, and therefore difficult to accomplish the downsizing of the package 151. Unfortunately, both sizing-up and insufficient downsizing of the package 151 increases not only the material cost but also the manufacturing cost of the substrate 152.

DISCLOSURE OF THE INVENTION

It is a primary object of the present invention to provide a compact semiconductor package which has excellent heat dissipation characteristics and can be manufactured with cheap manufacturing cost.

To achieve the foregoing and other objects and in accordance with the purpose of the present invention, an improved high density multi-layered printed wiring board is disclosed. The high density multi-layered printed wiring board includes: a substrate made of a material having higher heat conductivity than that of resins; a build-up layer formed on a first side of the substrate, the build-up layer being provided with interlayer insulations and conductive layers that are alternately laminated; an electronic parts mounting area defined on a top surface of the build-up layer; and a plurality of I/O terminals provided, on the top surface of the build-up layer, at an area between the mounting area for the electronic parts and an edge of the substrate. When an electric part or component is mounted on the first side of the high density multi-layered printed wiring board, heat generated by the electric part transfered from the first side to the second side and is efficiently released from the second side.

To achieve the foregoing and other objects and in accordance with the purpose of the present invention, an improved multi-chip carrier is disclosed. The multi-chip carrier includes a high density multi-layered printed wiring board as described above and a substrate supporter. The substrate supporter includes: a printed wiring board part consisting essentially of a resin material; a window formed around the center of the printed wiring board part to be fitted by the high density multi-layered printed wiring board while a second side of the substrate, which is opposite to the first side of the substrate, is exposed from the window; a plurality of bonding pads surrounding the window; a plurality of I/O terminals surrounding the group of the plurality of bonding pads; and at least one conductive pattern for electrically connecting each of the bonding pads and each of the I/O terminals.

To achieve the foregoing and other objects and in accordance with the purpose of the present invention, an improved semiconductor package is disclosed. The semiconductor packable includes a high density multi-layered printed wiring board as described above, a plurality of electronic parts mounted on the electronic parts mounting area provided on the build-up layer of the high density multi-layered printed wiring board, and a substrate supporter. The substrate supporter includes: a printed wiring board part consisting essentially of a resin material; a window formed around the center of the printed wiring board part to be fitted by the high density multi-layered printed wiring board while a second side of the substrate, which is opposite to the first side of the substrate, is exposed from the window; a plurality of bonding pads surrounding the window; a plurality of I/O terminals surrounding the group of the plurality of bonding pads; and at least one conductive pattern for electrically connecting each of the bonding pads and each of the I/O terminals. The I/O terminals on the build-up layer are electrically connected to the bonding pads on the substrate supporter.

To achieve the foregoing and other objects and in accordance with the purpose of the present invention, an improved semiconductor package is disclosed. The semiconductor package includes: a high density multi-layered printed wiring board as described above; a plurality of electronic parts mounted on the electronic parts mounting area located on the build-up layer of the high density multi-layered printed wiring board; a lead frame provided with a plurality of leads around an island supporting the high density multi-layered printed wiring board, the leads being electrically connected to the I/O terminals on the build-up layer; and a resin molding for sealing electrical connections with a second side of the substrate exposed.

BRIEF DESCRIPTION OF DRAWINGS

FIG. 4 is an enlarged sectional view of a part of FIG. 3.

BEST MODE FOR CARRYING OUT THE INVENTION

First embodiment

The semiconductor package according to the first embodiment of the present invention will now be described with reference to FIGS. 1 to 4.

Figure 3:
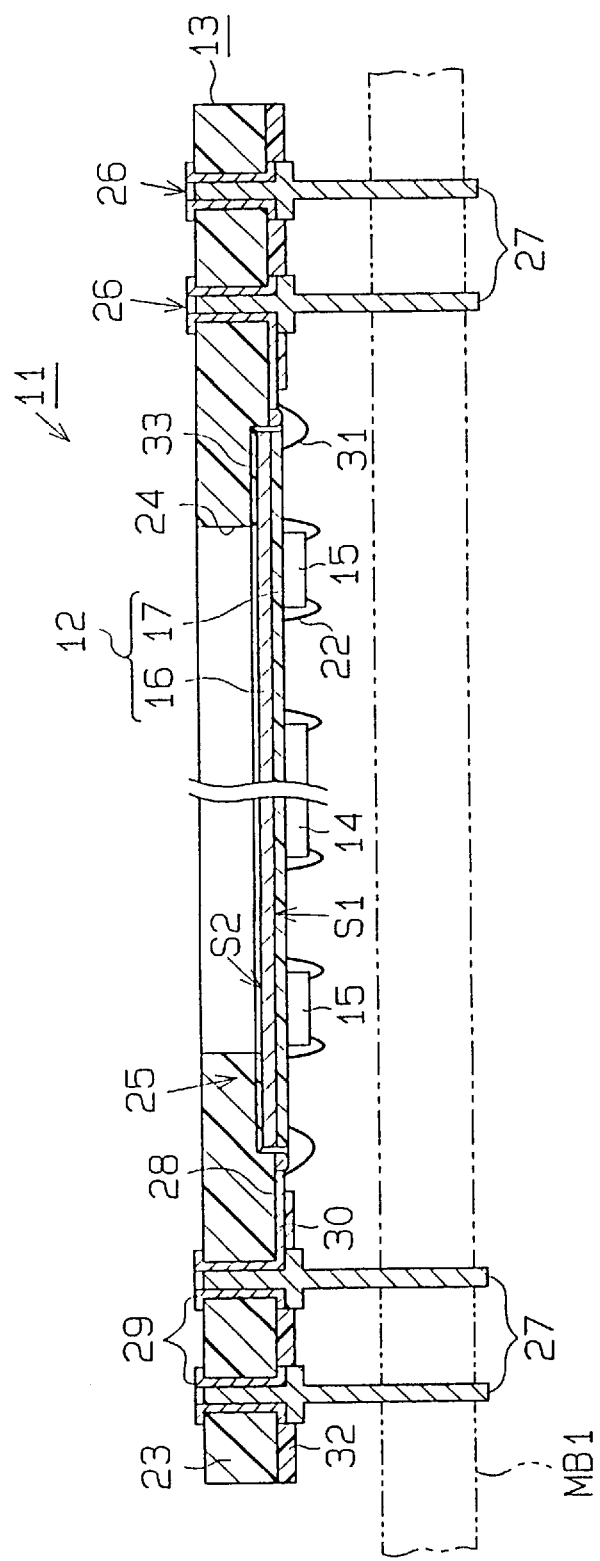
FIG. 3 is a partially sectional view of the semiconductor package of the first embodiment.

As shown in FIG. 3, a multi chip carrier constituting a semiconductor package 11 according to this embodiment includes a high density multi-layered printed wiring board (ML-PWB) 12 and a substrate supporter 13 for supporting the ML-PWB 12. The semiconductor package 11 is formed by mounting a plurality of large-scale integration (LSI) chips 14 and 15 as electronic parts on the supporter 13. This semiconductor package 11 falls under the category of multi-chip modules (MCM).

The ML-PWB 12 includes a substrate 16 having a higher thermal conductivity than resin materials. As shown in FIG. 4, a build-up layer 17 a thin film wiring layer is formed on a first surface S1 (i.e., top surface) of the substrate 16 to cover the entire surface of the first surface S1, while nothing is formed on a second surface S2 (bottom surface) of the substrate 16. The build-up layer 17 has conductive layers C1 to C5 and interlayer insulations I1 to I4 which are alternately laminated. The conductive layers C1 to C5 are formed from a plurality of different metals. Among the plurality different of metals, the amount of copper is largest. The conductive layers C1 to C5 are electrically connected with one another by way of interstitial via holes (IVHS) 18 formed in the interlayer insulations I1 to I4. It should therefore be understood that the major portion of the second surface S2 of the substrate 16 is a heat dissipating area and the whole first surface S1 is an electronic parts mounting area.

As shown in FIG. 4, a plurality of die pads 19 used as a mounting part for electronic parts, a plurality of bonding pads 20 and a plurality of I/O pads 21 used as I/O terminals are formed on the build-up layer 17. These pads 19, 20 and 21 serve as parts of the conductive layer C5 located at the top of the build-up layer 17.

The die pads 19 are laid out at several locations on the build-up layer 17. Two types of LSI chips 14 and 15 are die-bonded on the die pads 19. Each of the die pads 19 is surrounded by a plurality of the bonding pads 20. Terminals formed on the LSI chips 14 and 15 are connected to the bonding pads 20 via bonding wires 22. The I/O pads 21 are regularly laid out on the top peripheral portion of the build-up layer 17, which means that the I/O pads 21 surround the die pads 19 and bonding pads 20. The I/O pads 21 and the bonding pads 20 are electrically connected by the conductive layers C1 to C4, each of which has a desired pattern.

Figure 1:
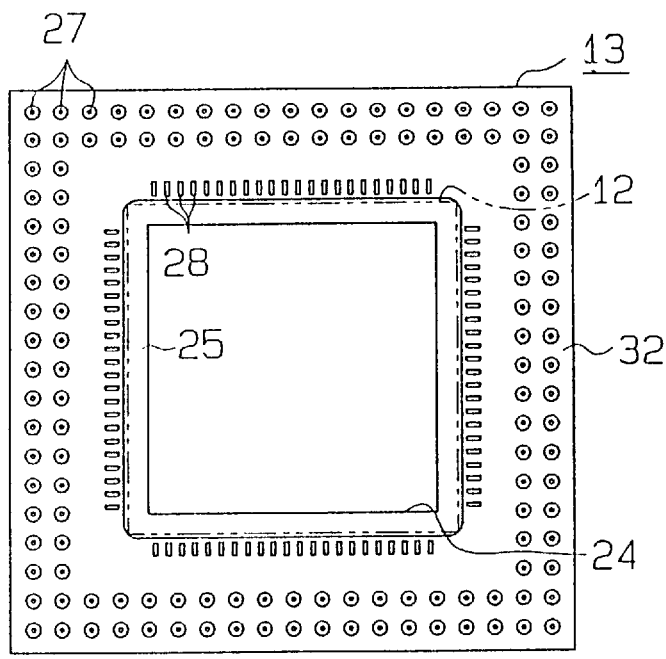
FIG. 1 is a plan view illustrating a supporter used for a semiconductor package of the first embodiment.
Figure 2:
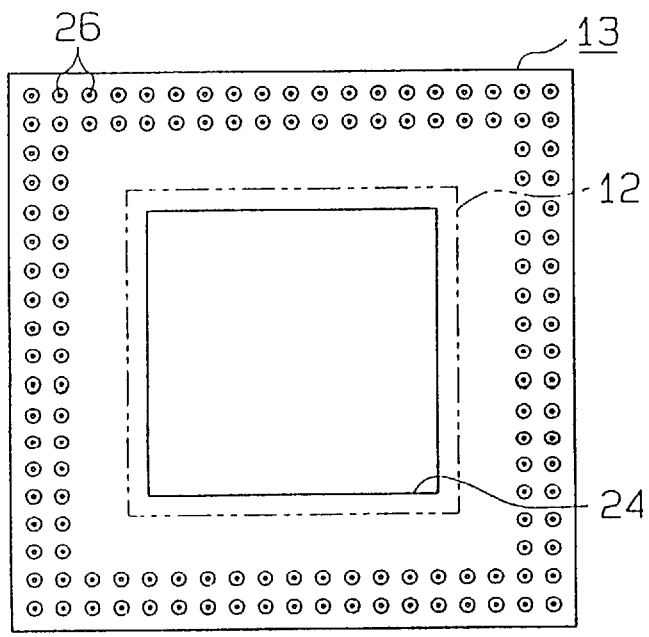
FIG. 2 is a bottom plan view of the supporter illustrated in FIG. 1.

The substrate supporter 13 shown in FIGS. 1 and 2 is manufactured from a conventional printed wiring board made of synthetic resin. This printed wiring board is a double-sided board 23 with two conductive layers. The supporter 13 has a square window 24 formed at the center thereof. The size of the window 24 is equal to the size of the high density ML-PWB 12. A step 25 is formed on the inner wall of the window 24. The ML-PWB 12 is fit into the space defined by the step 25 and the inner wall of the window 24. The window 24 is surrounded by a plurality of plated through holes 26. Metal I/O pins 27 as I/O terminals are implanted in the through holes 26. Each of the I/O pins 27 has a free end projecting from the top or front side of the board 23 shown in FIG. 4. It is not necessarily a requirement that one end of each I/O pin be inserted into the plated through holes 26. It is also possible to use nail head pins instead of the I/O pins 27. In this case, the nail heads of the pins are directly secured to the pads lying on the front surface of the supporter 13.

As shown in FIG. 3, bonding pads 28 are regularly laid out on the front side of the double-sided board 23 to surround the window 24. The bonding pads 28 are electrically connected to lands 29 for the plated through holes 26.

The bonding pads 28 on the side of the supporter 13 are electrically connected to the I/O pads 21 on the side of the ML-PWB 12 via bonding wires 31. The front side of the supporter 13 is coated with solder resist 32 to protect the interconnections 30 from moisture.

As shown in FIGS. 3 and 4, when the ML-PWB 12 is attached to the supporter 13, most of the heat dissipation area is exposed at the back side of the double-sided board 23 (i.e., the top side in FIG. 3 and the bottom side in FIG. 4). As shown in FIG. 3, the front side of the double-sided board 23 becomes almost flush with the first surface S1.

The semiconductor package 11 of this embodiment is mounted on a mother board MB1 which has a plurality of plated through holes (not shown). The pins 27 are inserted into the through holes of the mother board MB1 and are soldered thereto. When the package 11 is mounted on the mother board MB1, the electronic parts mounting area faces the mother board MB1 and the heat dissipating area faces the other side opposite to the mother board MB1. This arrangement is called "face down mounting". The heat dissipating area, more specifically a part of the heat dissipating area exposed in the window 24, is regarded as an effective area for dissipating heat from the semiconductor package 11.

A process of manufacturing the semiconductor package 11 will now be described.

1. Manufacturing a high density multi-layered Printed wiring board 12:

First, a plate made of material which has higher heat conductivity than resin material should be selected as a substrate 16. Therefore, the substrate 16 should be made of a metal or ceramic material. The following metals or sintered ceramics are considered to be suitable for the material of the substrate 16. The preferred metals include phosphor bronze, aluminum (Al), almetized steel, iron (Fe), copper (Cu) and a Cu-W alloy. The preferred sintered ceramics include aluminum nitride (AlN), alumina ($Al_2O_3$), boron nitride (BN), silicon nitride ($Si_3N_4$), silicon carbide (SiC) and mullite ($3Al_2O_3$, $2Sio_2$). It is preferable to select a ceramic substrate, in particular an aluminum nitride (AlN) substrate in order to obtain a multi-layered printed wiring board 12 with a better heat dissipation characteristic. In contrast, it is also preferable to select a metal substrate to obtain a multi-layered printed wiring board 12 which is less expensive and easy to manufacture.

The substrate 16 to be selected is preferably a plate with a flat surface. This is because a flat plate reduces the difficulty of forming the build-up layer 17. However, on the second side S2, on which the build-up layer 17 is not formed, the existence of asperities is permissible to an extent. Rather, such asperities could contribute to improve heat dissipation.

Varnish is applied to a side of the selected substrate 16 (a phosphor bronze substrate in this embodiment), using a varnish applying device or tool such as a roll coater. The varnish contains a resin material used to form the interlayer insulations I1 to I4. The applied varnish becomes solid as it dries up. The varnish in this embodiment contains a resin matrix, a resin filler, a resin hardening agent and a solvent. A resin matrix is less soluble to a surface roughening agent such as chromic acid, while a resin filler is very soluble to the same. Accordingly, the use of the surface roughening agent causes resin fillers in the interlayer insulations I1 to I4 to be selectively dissolved by the agent.

The materials used for the interlayer insulations I1 to I4, that is, the resin matrix, include polyimide resin, polyamide resin, epoxy resin, bismaleimide-triazine resin, divinylsiloxane-bis-benzocyclobutene resin, polyester resin, modified polyimide resin, modified bismaleimide-triazine resin, modified epoxy resin, triazine resin, polybutadiene, polysulphone resin, polyethersulphone resin, polyetherimide resin, polyphenyleneoxide resin, phenol resin and urea resin.

Among the resins listed above, it is preferable to select epoxy resin or bismaleimide-triazine resin, because these resins are advantageous to reduce the cost of manufacturing the printed wiring board 12 due to their comparatively low price.

The resins used for the interlayer insulations I1 to I4 are preferably photo-hardening type resins. Since these types of resins are suitable for photo-lithography, the use of such resins permits the interlayer insulations I1 to I4 to be more accurately formed. Thermosetting type resins can be also be adopted to form the interlayer insulations I1 to I4.

The interstitial via holes 18 are formed at proper locations in one of the interlayer insulations II to 14 with photo-lithography. Subsequently, the surface of the interlayer insulation is made rough with a surface roughing agent. A catalyst core made of a noble metal is fixed to the rough surface of the interlayer insulation. Resist for soldering (not shown) is formed on the interlayer insulation, thereafter the interlayer insulation is subjected to electroless plating with several types of plating baths. This electroless plating produces the interstitial via holes 18 and one of the conductive patterns C1 to C5. When a sequence of steps mentioned herein is repeated as needed, the interlayer insulations I1 to I4 and the alternately laminated conductive patterns C1 to C5 are produced.

2. Manufacturing the supporter 13:

A copper clad laminate (50 mm square, 1.7 mm thick) is required for this embodiment. The copper clad laminate has a core board made of glass epoxy. The peripheral portion of the copper clad laminate is subjected to piercing to form plated through holes. After the fixing and activation of catalyst cores, an electroless copper plating is performed to precipitate copper on the inner walls of the holes in the copper clad laminate. Then, the copper clad laminate is subjected to two steps of counter sinking to first form a cavity (35 mm square, 1.0 mm depth) in the central portion thereof and next to form a square through hole (31 mm square) in the cavity. This forms the window 24 with the step 25. After the application of resist for soldering, the copper clad laminate is subjected to electroless copper plating so that copper is precipitated in the areas other than the areas covered with soldering resist. Thereafter, the resist is exfoliated and a part of the copper covering is removed by etching. As a result, plated through holes 26, bonding pads 28 and conductive patterns 30 are formed. Soldering resist 32 is provided, which covers all areas except for the I/O pads 28 and the lands 29 for through holes 26. Lastly pins 27 are inserted into the holes 27, respectively.

3. Attaching the multi-layered printed wiring board to the supporter 13:

The wiring board 12 and the supporter 13, which have passed an open short defect test, should be used in the assembling process described below. First an adhesive sticker 33 (trade name: YEF-040, manufactured by Mitsubishi Yuka Kabushiki Kaisha) is placed on the step of the supporter 13. Next the wiring board 12 is placed in the window 24 so that the peripheral area of the side S1 of the substrate 16 is affixed to the step 25 by the adhesive sticker 30. A CPU LSI chip 14, which has passed a defective test, is diebonded to the die pad 19 located at the center of the wiring board 12. Six memory LSI chips 15, which have also passed defective test, are diebonded to the die pads 19 surrounding the CPU LSI chip 14. By using a wire bonder, the terminals of the LSI chips 14 and 15 are connected to the associated bonding pads 20 via the bonding wires 23, and subsequently the I/O pads 21 and the bonding pads 28 are connected to each other via the bonding wires 31. The wire bonding produces an electrical connection between the wiring board 12 and the supporter 13, completing the manufacture of the semiconductor package 11.

The package 11 of this embodiment is characterized by the build-up layer 17 formed on one side of the substrate 13 constituting a high density multi-layered printed wiring board 12. This structure does not produce any dead areas whose size is equal to the size of the substrate 12 on the surface of the package 11, even when the package 11 is assembled with the supporter 13. Accordingly, sufficient heat dissipating area can be obtained without upsizing the semiconductor package 11. Downsizing of the package 11 brings about an improvement of the signal propagation speed. Consequently the electric characteristic of the package 11 is improved. The improvement of the heat dissipating efficiency of the package 11 allows the LSI chips 14 and 15 to have much lower incidence of malfunction and breaking down due to the overheating, compared with the LSI chips mounted on conventional packages.

With the wiring board 12 and the supporter 13 combined, the package 11 has a heat dissipating area formed on one side of the substrate 16 and the major portion of this heat dissipating area is exposed from the window 24. Accordingly, the package 11 has a heat dissipating path across the board 12 in the direction of its thickness, i.e., from the build-up layer 17 (electronics mounting area) to the heat dissipating area via the substrate 16. Heat generated by the LSI chips 14 and 15 reach the second side S2 of the substrate 16 through the heat dissipating path. Since the substrate 16 is made of the material having higher heat conductivity than resin materials, the heat quickly propagates in the heat dissipating path. The heat is dissipated with high efficiency to the atmosphere from the second side S2 through the window 24.

The package 11 of this embodiment is also characterized by the step 25 provided in the window 24 and the wiring board 12 provided in the space defined by the step 25 and the interior portion of the window 24. This structure allows the wiring board 12 to be firmly supported by the supporter 13, and also allows the surface of the wiring board 12 to be flush with the surface of the supporter 13, facilitating the wire bonding process to connect the wiring board 12 and the supporter 13. This structure, moreover, is advantageous in making the package 11 thinner.

In this embodiment, the build-up layer 17 is formed only on the first side S1 of the substrate 16, while nothing in particular is formed on the second side S2. There is no need for forming plated through holes for conduction in the substrate 16. This eliminates the process of piercing the substrate 16. As a result, the manufacturing cost of the package 11 is reduced. The package 11 is characterized by the I/O pins 27 placed on the supporter 13 which is primarily comprised of a copper clad laminate made of resin. Generally, copper clad laminates are inexpensive and easy to work with. Manufacturing a package 11 with copper clad laminate therefore costs less than conventional packages comprised of only metal components or only ceramic components.

The supporter 13 of this embodiment can be used for a wide variety of purposes, as the type, material and shape of the wiring board 12 to be attached can be freely selected to meet the purpose of the package.

According to this embodiment, a plurality of LSI chips 14 and 15 can be mounted on a single wiring board 12. In contrast, conventional packages require heat slugs, the number of which matches the number of the LSI chips mounted thereon. Additionally, in order to fit the heat slugs into a substrate, chip-sized through holes must be formed at several locations in the substrate. This means that the design of the package 11 according to this embodiment is preferable over conventional packages because it simplifies the manufacturing process.

The package 11 manufactured by the above-mentioned process has a wide heat dissipating area of 60% to 80% with respect to the projected area of the package 11. Even with the wide heat dissipating area, the package 11 has about half the size of a conventional package. In other words, the package design according to this embodiment achieves the downsizing of the package as well as the improvement of heat dissipation characteristics.

Second Embodiment

The structure and manufacturing method of the semiconductor package according to the second embodiment of the present invention will now be described. This embodiment mainly includes modifications to the build-up layer which is a thin film wiring layer.

The build-up layer of the semiconductor package of this embodiment has conductive layers and interlayer insulations laminated alternately as in the case of the first embodiment. The first conductive layer to be attached on the substrate consists of a metal thin film or a plurality of thin films of different types. Each of the other conductive layers consists of a groundwork layer and a copper conductive layer e.g. a copper plating layer. The groundwork layer is comprised of a metal thin film or two metal thin films of different types, while the copper conductive layer is formed on the groundwork layer. Each of the metal thin films is formed with spattering. The resin to form the interlayer insulation can be selected from among the resins listed in the first embodiment. It is preferable to select a resin with low reactivity to copper and a low percentage of contraction when it hardens. To satisfy these conditions, selecting epoxy resin or bismalemide-triazine resin is recommended.

After forming the first conductive layer on the substrate, photo-setting or non-photo-setting varnish is applied on the substrate to form the first interlayer insulation. The varnish is applied according to a spin coating process. A spin-coater comprisied of a rotating table is used for the spin coating process. First a substrate is placed in a horizontal position on the rotating table. After varnish is provided on the central part of the substrate, the table starts to rotate. The varnish is spread on the whole surface of the substrate by the action of centrifugal force. Consequently a thin and evenly spread film of varnish is formed on the substrate. Then the film of varnish is dried and set. The varnish is not designed for an additive process, therefore does not have soluble resin filler in it.

The preferable thickness of the resin applied by the spin-coater is 5 to 70 $\mu$m and the preferable thickness of the interlayer insulations finally obtained is 3 to 50 $\mu$m. If the thickness of the resin is less than 5 $\mu$m, the conductive layer may not be covered thoroughly by the resin. On the contrary, if the thickness of the resin exceeds 50 $\mu$m, the advantages of the spin coating method cannot be sufficiently utilized. Setting the thickness of the interlayer insulation from 3 to 50 $\mu$m contributes to the improvement of the electric characteristic of the package while making the wiring board thinner.

The procedure of forming the second and other conductive layers and the second interlayer insulations will be explained later below.

The first interlayer insulation is given a reverse sputtering treatment prior to being given a normal sputtering treatment. In a normal sputtering treatment, the target material is connected to a cathode and the substrate is connected to an anode. In a reverse sputtering treatment, the target material is connected to an anode and the substrate is connected to a cathode. A reverse sputtering treatment shifts ions to the side of the substrate and causes ions to collide with the substrate strongly. The shock of the ions partly shaves off the interlayer insulation on the substrate. As a result, microscopic indentations are formed on the surface of the interlayer insulation. In other words, a reverse sputtering can make the surface of the interlayer insulation rough. An advantage of a reverse sputtering treatment is that a normal sputtering treatment is possible immediately after a reverse sputtering treatment in the same vacuum bath. A gas, for example nitrogen, argon, helium, neon or krypton, can be the inert gas to fill the vacuum bath during a reverse or normal sputtering. Using argon as the inert gas brings a metal thin film formed through a normal sputtering treatment into intimate contact with the interlayer insulation. Using nitrogen prevents the residue after the etching of a metal thin film from remaining on the surface of the interlayer insulation. Therefore the insulations between adjacent conductive layers are ensured.

A normal sputtering treatment forms a metal thin film on the top side of the first interlayer insulation. On the surface of the metal thin film, a copper thin film is formed as required. consequently a groundwork layer consisting of one or two kinds of metal is formed on the top side of the interlayer insulation.

A metal, for example chromium, nickel, titanium, iron, tungsten, molybdenum, aluminum of cobalt can be sputtered before the copper thin film is formed on the surface of the interlayer insulation. Using one of the above mentioned metals as the target material forms a metal thin film which is close-grained and smooth and has a high adhesion to the interlayer insulation. This metal thin film can be removed by the use of a simply composed etchant which has no oxidant. It is therefore suitable for patterning. Forming a copper thin film is optional. If it is formed, the copper thin film improve the contact of the copper-plated layer and metal thin layer.

It is preferable to set the thickness of the metal thin layer between 0.05 $\mu$m and 0.3 $\mu$m. Further, it is preferable to set the thickness of the copper thin layer between 0.05 $\mu$m and 0.6 $\mu$m. It is preferable to set the total thickness of the groundwork layer 1.0 $\mu$m or less.

If the metal thin layer is too thin, it can have parts with bad contact to the interlayer insulations and exfoliation and swelling of the metal thin layer become more likely to happen. On the other hand, forming a metal thin layer which is too thick does not bring about a further improvement of the contact despite the additional time and cost it requires. If the copper thin layer is too thin, it might be impossible to improve the contact of the copper-plated layer. On the other hand, forming a copper thin layer which is too thick does not bring about a further improvement of the contact despite the additional time and cost it requires.

If nickel is selected as a metal to be sputtered, copper sputtering on the metal thin film can be omitted. This is because copper bonds with nickel better than with other materials.

On the surface of the groundwork layer, a copper conductor layer is formed after plate resist is formed. A copper plating layer is formed as the copper conductor layer by either electrolytic copper plating or electroless copper plating. It is preferable to select electrolytic copper plating for its speed in forming films and its simple equipment. Since it has the biggest influence on the reduction of the electrical resistance in the conductive layer, the copper plating layer is formed a little thicker than the groundwork layer. However, if the copper plating layer is too thick, asperities on the surface of the interlayer insulation become bigger, which might make it difficult to apply resin on it by a spin coater. It is therefore preferable to set the thickness of the copper plating layer to between 2 $\mu$m and 30 $\mu$m and it is more preferable to set the thickness between 2 $\mu$m and 10 $\mu$m. The copper conductive layer can be formed by methods other than plating.

After the copper plating layer is formed, unnecessary plating resist and the groundwork layer beneath the resist are removed by etching. This etching forms the second and other conductive layers. The first method for forming second and other conductive layers has just been explained above.

The second method for forming a build-up layer will now be explained. According to this method, etching is done after resist is formed on the surface of the groundwork layer. As a result, the groundwork layer is etched to form a pattern. Next, exfoliation of the resist exposes the groundwork layer protected by the resist. Then a copper conductor layer, such as a copper plating layer, is formed on the surface of the exposed groundwork layer. An conductive layer (as in the first method explained above) can be obtained through this second method.

For the wiring board in this embodiment, metal which improves the adhesion of the conductive layers is employed as the metal used to form the metal thin film. It is therefore possible to obtain conductive layers which are resistant to exfoliation. Another characteristic of this embodiment is that the metal thin films are formed through a physical and dry film forming method called sputtering. A metal thin film formed through this method is generally more close-grained and smoother, and has better adhesion properties compared to a metal thin film formed through a wet film forming method. In the case of the wiring board of this embodiment, the metal thin films serve as groundwork layers for the copper conductive layer, e.g. Cu plating layer. It is therefore possible to bring a conductive layer into more intimate contact with an interlayer insulation without the use of chemical agents to roughen the surface of the interlayer insulation.

Another characteristic of the embodiment is that resin varnish is applied through a spin coating method. This makes it easy to obtain thin and even interlayer insulations and to bring the thickness of the insulations close to a predetermined value. Another characteristic of this embodiment is that the surface of the interlayer insulations are roughened through reverse sputtering. It is therefore not necessary to roughen the surface of a interlayer insulation with chemical agents before conductive layers is formed. This simplifies the manufacturing process and reduces the manufacturing cost of the wiring board.

The following are some examples of this embodiment.

1st example

Step 1: a substrate 16 made of phosphor bronze (Cu: Sn: P=95: 4.8: 0.2) was selected. The first conductive layer C1 was formed on a surface of the substrate 16 through a sputtering treatment of Ti, Mo, Ni. Next, the surface is roughened through a blackening treatment.

Step 2: a varnish of photo-setting epoxy resin consisting of the materials given below was selected as a resin to form interlayer insulations I1 to I5.

cresolnovolacacrylate: 66 wt %, bisphenol A resin: 21 wt %, sensitizer: 6 wt %, hardener: 3 wt %, photo polymerization agent: 3 wt %, surface-control agent: 1 wt %.

Figure 5A:
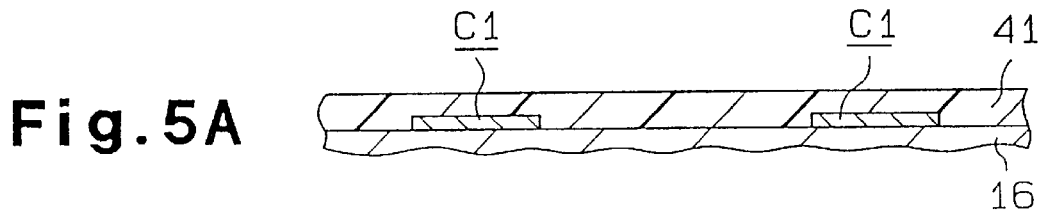
FIGS. 5A, 5B, 5C, 5D, 5E and 5F are sectional views illustrating a sequence of steps for producing build-up layers (reference examples 1 to 10) in a second embodiment.
Figure 5B:
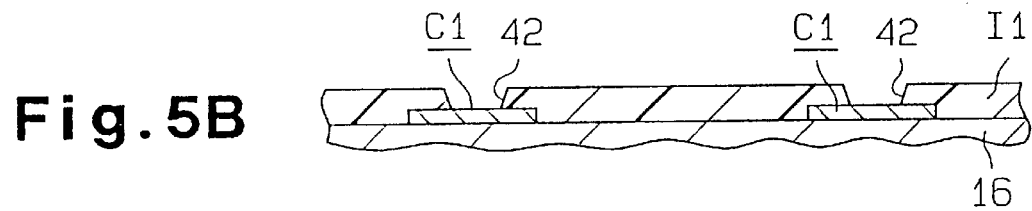

As shown in FIG. 5A, varnish of the resin was applied to the substrate 16 by the use of a spin coater (trade name: IH-DK, manufactured by Mikasa). The thickness of the varnish 41 was set at 30 $\mu$m in order to make the thickness of the interlayer insulation I1 20 $\mu$m.

Step 3: After being pre-baked, the varnish 41 was exposed to light and developed. Then it was cured at 180 degrees centigrade for 60 minutes. The above-mentioned steps formed the first interlayer insulation I1 having holes 42 to form interstential via holes.

Step 4: The interlalyer insulation was subjected to reverse sputtering in a nitrogen atmosphere of 0.8 Pa for 2 minutes by the use of a vacuum sputtering device (trade name: CFS-8EP, manufactured by Tokudaseisakusho). The reverse sputtering processed the surface of the interlayer insulation I1.

Figure 5C:
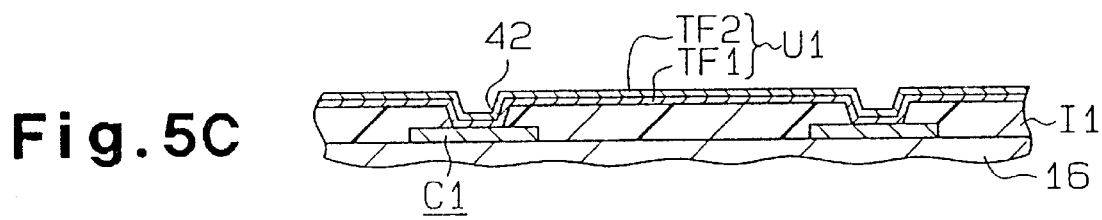

Step 5: A 0.1-$\mu$m-thick chrome thin film TF1 as a first metal thin film was formed on the processed surface of the interlayer insulation I1 through a chrome sputtering by the vacuum sputtering device used in the preceding step. Then a 0.2-$\mu$m-thick copper thin film as a second metal thin film TF2 was formed on the chrome thin film TF1 through a copper sputtering by the vacuum sputtering device. As shown in FIG. 5C, a 0.3-$\mu$m-thick groundwork layer U1 consisting of two metals was formed. In this example, the gas pressure of the chrome sputtering was set at 0.8 Pa and the process time was set for 10 minutes. The gas pressure of the copper sputtering was set at 0.8 Pa and the process time was set for 20 minutes.

Step 6: Varnish of a photo-setting resin (Tokyo Ouka product: OMR-83/60cps) to form plate resist was applied on the groundwork layer U1 by the use of a spin coater. After being pre-baked, the applied varnish was exposed to light, developed and postbaked. Consequently a plating resist 43 shaped like channels was formed on the surface of the groundwork layer U1 to form a conductive layer C2 (L/S=30 $\mu$m/50 $\mu$m). The groundwork layer U1 was partially exposed by the plating resist 43.

Step 7: A copper electroplating by the use of the copper electroplating bath described below formed a 10-$\mu$m-thick copper electroplating layer EP1 as a copper conductive layer on the groundwork layer U1.

$H_2SO_4 \cdot 5H_2O$: 210 g/l, $H_2SO_4$: 60 g/l, ions of chlorine: 25 mg/l, additive: a little, temperature: 28 degrees centigrade, density of cathode current: 2.5 A/dm$^2$, process time: 10 minutes.

Figure 5D:
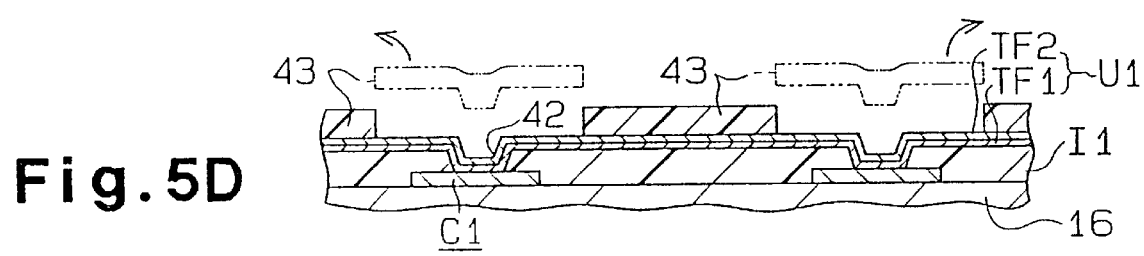
Figure 5E:
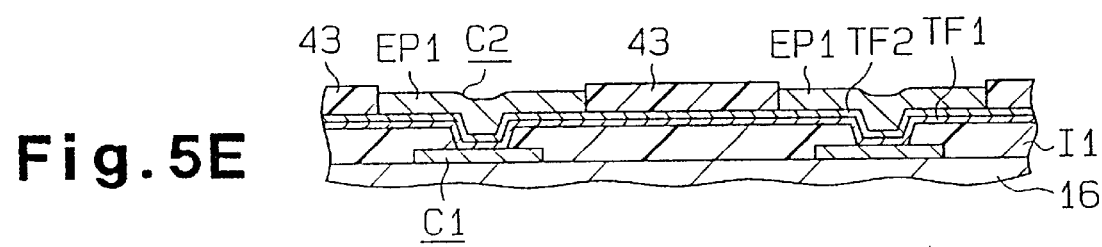
Figure 5F:
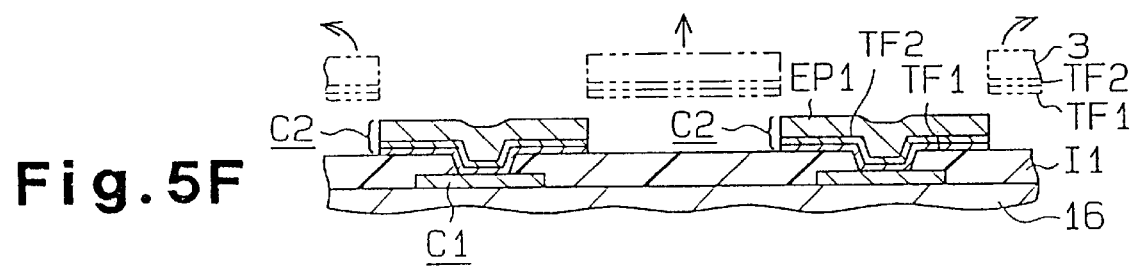

Step 8: Having become unnecessary, the plating resist 43 was delaminated from the groundwork layer U1 by etching the substrate 16 with a delaminating agent (trade name: OMR hakurieki, manufactured by Tokyo Ouka) intended for the purpose. The copper thin film TF2 located beneath the plating resist 43 was subjected to an etching with an aqueous solution of 10% nitric acid as the etchant. Subsequently the chrome thin film TF1 located beneath the plating resist 43 was subjected to an etching with an aqueous solution of 20% hydrochloric acid as the etchant. Consequently a groundwork layer, which was constructed of chrome thin-layer TF1 and copper thin layer TF2, and a conductive layer C2, which was constructed of the copper electroplating layer EP1, were formed as shown in FIG. 5F.

Step 9: Repeating the steps 2 to 8 formed conductive layers C3 to C6 and interlayer insulations I2 to I5 sequentially. Eventually a high density ML-PWB 45, which has the build-up layer 44 shown in FIG. 6, was manufactured.

Table 2 shows the results of investigations of the following features of ML-PWB 45 formed through the above mentioned steps.

1. the dimensional accuracy of the width of line L of the conductive layers C2 to C6.
2. the dimensional accuracy of the thickness of the interlayer insulations I1 to I5.
3. the pull strength of the conductive layer C2 to C6.

The width of line L was closely analogous to the setting of 30 μm. The thickness of the interlayer insulations I1 to I5 was also closely analogous to the setting of 20 μm. Moreover, the measurement value of the pull strength exceeded 2.0 kgf/mm$^2$.

Example 2

Steps 1 to 4 of this example are the same as steps 1 to 4 of example 1.

Step 5: A 0.1-μm-thick titanium thin film TF1 as a first metal thin film was formed on the processed surface of the interlayer insulation I1 through titanium sputtering by the above mentioned vacuum sputtering device. Then a 0.2-μm-thick copper thin film TF2 as a second metal thin film TF2 was formed on the titanium thin film TF1 through a copper sputtering by the vacuum sputtering device. As shown in FIG. 5C, a 0.3-μm-thick groundwork layer U1 consisting of two metals was formed.

Steps 6 to 9 of this example are the same as steps 6 to 9 of example 1. Subsequently a ML-PWB 45 shown in FIG. 6 was formed.

As shown in Table 2, the widths of line L of the conductive layers C2 to C6 and the thickness of the interlayer insulations I1 to I5 were closely analogous to the desired settings as in the case of Example 1. The measurement value of the pull strength exceeded 2.0 kgf/mm$^2$.

Example 3

Example 3 was basically the same as Example 2 except that nickel was used to form a first metal thin film TF1 instead of titanium. The result of Example 3 was as favorable was those of Examples 1 and 2.

Example 4

Step 1: a substrate made of alumina (Al$_2$O$_3$=92%) was selected for Example 4. A first conductive layer C1 was formed through a sputtering of Ti, Mo, Ni. Then the first conductive layer C1 was subjected to a blackening treatment.

Step 2: Applying a varnish of resin as described in Example 1 by a spin coater formed an interlayer insulation I1 on the conductive layer C1. In Example 4, the thickness of the varnish applied on the substrate 16 was set at 17 μm in order to make the thickness of interlayer insulation I1 10 μm.

Steps 3 to 5 are the same as the Steps 3 to 5 in Example 1.

Step 6: Varnish 41 of a photo-setting resin used in the first embodiment to form plate resist was applied on the groundwork layer U1 by the use of a spin coater. After being pre-baked, the applied varnish was exposed to light, developed and postbaked. Consequently a plating resist 43 shaped like channels was formed on the surface of the groundwork layer U1 to form a conductive layer C2 (L/S=15 μm/20 μm).

Step 7: As shown in FIG. 5E, copper electroplating by the use of the copper electroplating bath as described in Example 1 formed a 6-μm-thick copper electroplating layer EP1 as a copper conductive layer on the groundwork layer U1.

Figure 6:
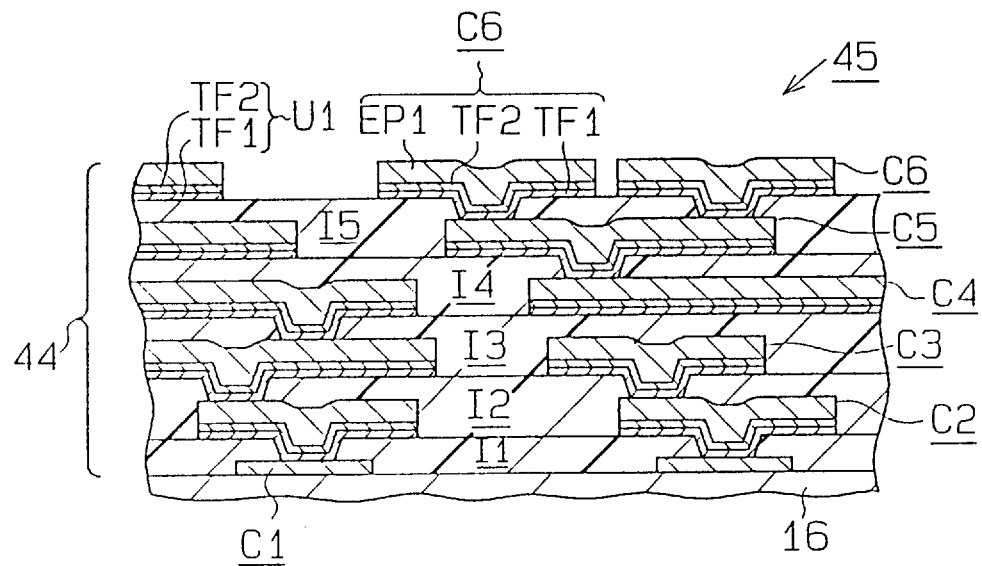
FIG. 6 is a sectional view of a part of the build-up layers (examples 1 to 9) in the second embodiment.

Steps 8 and 9 are the same as the Steps 8 and 9 in Example 1. Subsequently, ML-PWB 45 as shown in FIG. 6 was formed.

As shown in Table 2, the widths of line L of the conductive layers C2 to C6 and the thickness of the interlayer insulations I1 to I5 are closely analogous to the desired settings as in the case of Example 1. The measurement value of the pull strength exceeded 2.0 kgf/mm$^2$.

Example 5

Example 5 was basically the same as Example 4 except that titanium was used to form a first metal thin film TF1 instead of chromium. The result of Example 5 was as favorable as that of Example 4.

Example 6

Example 6 was basically the same as Example 4 except that nickel was used to form a first metal thin film TF1 instead of chromium. The result of Example 6 was as favorable as those of Example 4 and Example 5.

Example 7

Step 1: An aluminum nitride substrate (AlN: Y$_2$O$_3$=96: 4) 16 weLs selected as a substrate 16 in Example 7. A first conductive layer C1 was formed through a sputtering of Ti, Mo, Ni. Then the first conductive layer C1 was subjected to a blackening treatment.

Step 2: Applying a varnish 41 of resin as described in Example 1 by a spin coater formed an interlayer insulation I1 on the conductive layer C1. In Example 7, the thickness of the varnish applied on the substrate 16 was set at 10 μm in order to make the thickness of interlayer insulation I1 5 μm. Steps 3 to 5 are the same as Steps 3 to 5 in Example 1.

Step 6: Varnish of a resin as described in Example 1 to form plate resist was applied on the groundwork layer U1 by the u;se of the spin coater. After being pre-baked, the applied varnish was exposed to light, developed and postbaked. consequently, as shown in FIG. 5D, a plating resist 43 shaped like channels was formed on the surface of the groundwork layer U1 to form a conductive layer C2 (L/S=4 μm/6 μm).

Step 7: As shown in FIG. 5E, a copper electroplating by the use of the copper electroplating bath as described in Example 1 formed a 1.5-μm-thick copper electroplating layer EP1 as a copper conductive layer on the groundwork layer U1.

Steps 8 and 9 are the same as the Steps 8 and 9 in Example 1. Subsequently, ML-PWB 45 as shown in FIG. 6 was formed.

The conductive layers C2 to C6 in the substrate 45 were extremely fine compared with those of Examples 1 to 6 (see Table 2). However the widths of line L and the thickness of the interlayer insulations I1 to I5 were closely analogous to the desired settings. Moreover, the measurement value of the pull strength exceeded 2.0 kgf/mm$^2$.

Example 8

Example 8 was basically the same as Example 7 except that titanium was used to form a first metal thin film TF1 instead of chromium. The result of Example 8 was as favorable as that of Example 7.

Example 9

Example 9 was basically the same as Example 7 except that nickel was used to form a first metal thin film TF1 instead of chromium. The result of Example 9 was as preferable as that of Example 7.

Example 10

Steps 1 to 4 are the same as the Steps 1 to 4 in Example 1.

Step 5: A 0.1-μm-thick nickel thin film TF1 (or an underground layer consisting of a metal) was formed on the processed surface of the interlayer insulation I1 through a nickel sputtering by a vacuum sputtering device. The gas pressure and the process time of the nickel sputtering were the same as those of Example 1.

Steps 6 and 7 are the same as the Steps 6 and 7 in Example 1.

Step 8: The plating resist 43 was delaminated from the groundwork layer U1 by etching the phosphor bronze substrate 16 with a delaminating agent (trade name: OMR hakurieki, manufactured by Tokyo Ouka) intended for the purpose. The nickel thin film TF1 located beneath the plating resist 43 was subjected to an etching with an aqueous solution of 20% hydrochloric acid as the etchant. Consequently a conductive layer C2 constructed of the nickel thin film TF1 and the copper electroplating layer EP1 was formed.

Figure 7:
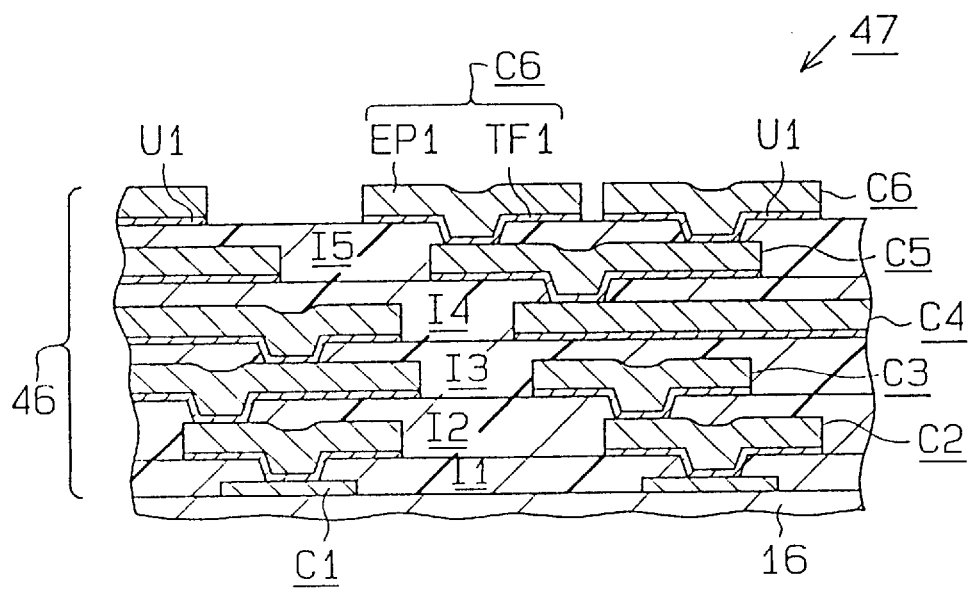
FIG. 7 is a section view of a part of the build-up layer (example 10) in the second embodiment.

Step 9: Repeating the steps 2 to 8 formed conductive layers C3 to C6 and interlayer insulations I2 to I5 sequentially. Eventually a high density ML-PWB 47, which has a build-up layer 46 shown in FIG. 7, was manufactured.

The widths of line L and the thickness of the interlayer insulations I1 to I5 were closely analogous to the desired settings. Moreover, the measurement value of the pull strength exceeded 2.0 kgf/mm$^2$.

As described above, the groundwork layer U1 in Example 10 consisted only of one thin metal. However, it has almost the same performance as the groundwork layers in Examples 1 to 9. Moreover, adopting the structure reduces the time for sputtering. This reduces the time as well as the cost for manufacturing a ML-PWB.

Example 11

Figure 8A:
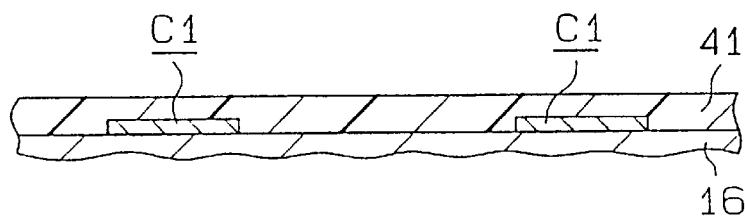
FIGS. 8A, 8B, 8C, 8D, 8E and 8F are sectional views illustrating a sequence of steps for producing a build-up layer (example 11) in the second embodiment.
Figure 8B:
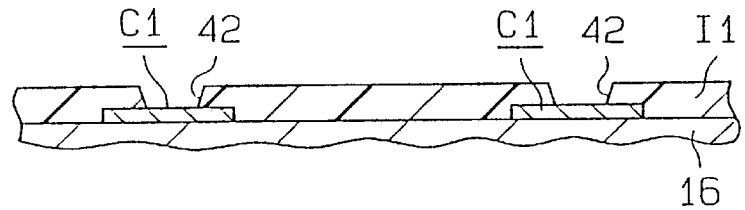
Figure 8C:
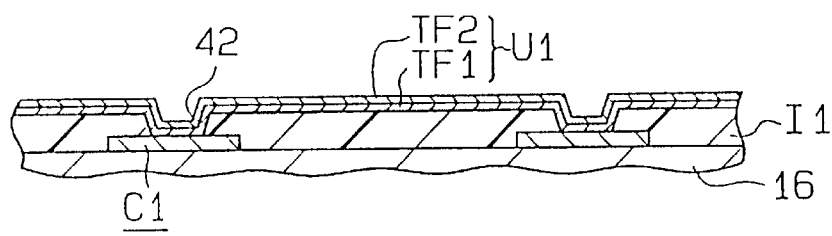

Steps 1 to 5 were the same as the Steps 1 to 5 in Example 2. As shown in FIG. 8C, a groundwork layer U1 was formed on a interlayer insulation I1.

Figure 8D:
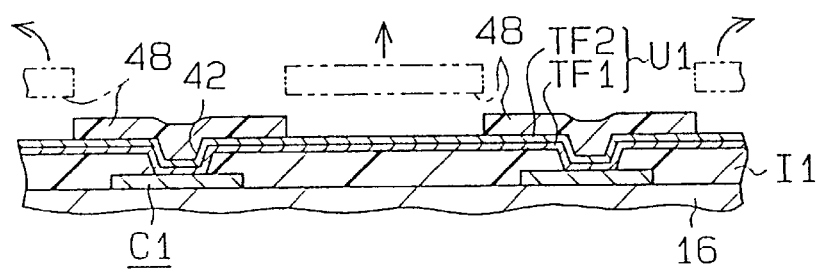

Step 6: The varnish (trade name: AZ-4200, manufactured by Hoechst) of a photo-setting resin to form plating resist was applied on the groundwork layer U1 by the use of a spin coater. The amount of resin to be applied was set to obtain a 3-μm-thick resist 48 in the end. After being pre-baked, the applied varnish was exposed to light, developed and post-baked. Consequently, as shown in FIG. 8D, a plating resist 48 shaped like channels was formed on the surface of the groundwork layer U1 to form a conductive layer C2 (L/S=15 μm/20 μm).

Figure 8E:
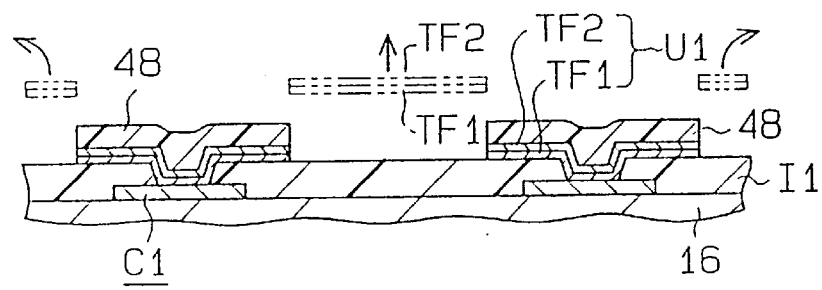
Figure 8F:
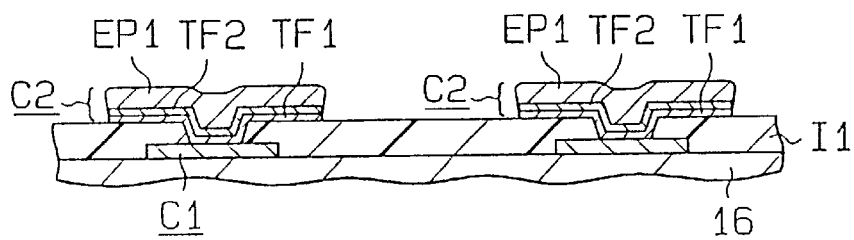

Step 7: the copper thin film TF2 located beneath the resist 48 was subjected to an etching with an aqueous solution of 10% nitric acid as the etchant. The chrome thin film TF1 also located beneath the resist 48 was subjected to an etching with an aqueous solution of 20% hydrochloric acid as the etchant. As a result, the groundwork layer U1 was shaped like a pattern as shown in FIG. 8E.

Step 8: After delaminating the resist 48, the substrate 16 was subjected to a copper electroless deposition by the use of a copper electroless deposition bath described below. The copper electroless deposition formed a 6-μm-thick copper electroless deposition layer EP1 as a copper conductive layer on the groundwork layer U1.

CuSO$_4$ · 5H$_2$O: 0.05 mol/l, HCHO: 0.12 mol/l,
NaOH: 0.15 mol/l, EDTA·4Na: 0.10 mol/l,
KNi(CN)$_3$: 10 mg/l, α·α'-dipyridyl: a little,
pH=12.5, the temperature: 60 degrees centigrade,
the process time: 2 hours.

Consequently, a groundwork layer U1, which consisted of chrome thin film TF1 and copper thin film TF2, and a conductive layer C2, which consisted of the copper electroless deposition layer EP1, were formed.

Step 9: Repeating the steps 2 to 8 formed conductive layers C3 to C6 and interlayer insulations I2 to I5 sequentially. Eventually a high density ML-PWB 45, which has a build-up layer 44 shown in FIG. 6, was manufactured.

As shown in Table 2, the widths of line L and the thickness of the interlayer insulations I1 to I5 were closely analogous to the desired settings as in the case of the Examples 1 to 11. The measurement value of the pull strength exceeded 2.0 kgf/mm$^2$.

Example 12 (reference example)

Step 1: a copper clad laminate (FR-4) was selected as a substrate. A first conductive layer was formed according to the conventional substractive process on the substrate. The first conductive layer was subjected to a blackening treatment.

Step 2: a varnish of photo-setting epoxy resin consisting of the materials given below was selected as a resin varnish to form interlayer insulations. The varnish was applied to the substrate by the use of a roll coater.

cresolnovolacacrylate: 53 wt %,
bisphenol: 17 wt %, epoxy resin filler: 19 wt %,
sensitizer: 5 wt %, hardener: 2 wt %,
photo polymerization agent: 3 wt %,
surface-control agent: 1 wt %.

The thickness of the varnish was set at 90 μm in order to make the thickness of the interlayer insulation 55 μm.

Step 3: After being pre-baked, the varnish was exposed to light and developed. Then it was cured at 150 degrees centigrade for 180 minutes. The above-mentioned steps formed the first interlayer insulation having holes 42 to form interstential via holes.

Step 4: After the surface of the interlayer insulation was roughened by a chromium oxide treatment lasting 60 minutes, Pd-Sn catalyst core was given to the roughened surface. The varnish of the photo-setting epoxy resin was applied. The thickness of the varnish was set to 30 μm. Then the varnish was dried, exposed to light and developed. Consequently a plating resist shaped like channels was formed for forming a conductive layer (L/S=75 μm/75 μm).

Step 5: After activating the Pd-Sn catalyst core, the substrate was subjected to a copper electroless deposition by the use of a copper electroless deposition bath for thickening described below. The copper electroless deposition formed a 30-μm-thick copper electroless deposition layer on a part of the substrate where no plating resist was formed.

CuSO$_4$·5H$_2$O: 0.05 mol/l, HCHO: 0.12 mol/l,
NaOH: 0.15 mol/l, EDTA·4Na: 0.10 mol/l,
KNi(CN)$_3$: 10 mg/l, α·α'-dipyridyl: a little,
pH=12.5, the temperature: 60 degrees centigrade,
the process time: 6 hours.

Step 6: Repeating the steps 2 to 5 formed the third and the rest of the conductive layers and the second and the rest of interlayer insulations sequentially. Eventually an additive multi-layered printed wiring board, which has build-up layers, was manufactured. The wiring board is to serve as a comparison with the previous Examples.

As shown in Table 2, the error of the width of line L was much bigger than those of Examples 1 to 11. The error of the thickness of the interlayer insulations had the same tendency to be much bigger than those of Examples 1 to 11. It is surmised that the causes of these consequences are the aggravation of roughness of the interlayer insulations, asperities made by the roughening process on the surface, and so on. The measured value of the pull strength was 1.0 kgf/mm$^2$, which was less than half the measured values of the pull strength of Examples 1 to 11. Since the method of Example 12 requires a roughening process and thickening copper electroless deposition, the process time is longer than those required in Examples 1 to 11.

Third Embodiment

The structure and manufacturing method of the semiconductor package according to the third embodiment of the present invention will now be described.

The embodiment is mainly to improve the contact of the top surface of a copper conductive layer such as a copper plating layer, which consists of a conductive layer, and the bottom surface of an interlayer insulation. More particularly, a thin film made of a metal, which serves the purpose of improving the contact of these layers is placed between them. The build-up layer of the embodiment is constituted by conductive layers and interlayer insulations laminated alternately as in the case of the second embodiment. Except for the first layer, the conductive layers consist of a groundwork layer constituted by a metal thin film or two different metal thin films, a copper conductive layer such as copper plating layer formed on the groundwork layer and the above mentioned metal thin film (cover layer). The cover layer is preferably formed on the periphery of a copper conductive layer as well as on its top surface. This structure enhances the effect of the cover layer. The forming process of interlayer insulations, the groundwork layer and copper conductive layers in the build-up layer is not particularly different from that of the second embodiment.

A cover layer can be formed through a wet process such as an electroplating or an electroless deposition to a copper conductive layer. For example, nickel can be selected as a metal to form a cover layer. A hard and thin oxide film is formed on the surface of a nickel plating. The oxide film is considered to contribute to the improvement of the contact between the two materials sandwiching it. A cover layer can also be formed with metals like chrome, molybdenum, titanium, tungsten. It is preferable to select nickel for an electroplating process to reduce the cost of manufacturing wiring boards. A cover layer also can be formed through dry process such as sputtering.

The thickness of a cover layer preferably ranges from 0.5 $\mu$m to 2.0 $\mu$m. With a cover layer formed thinner than 0.5 $\mu$m, the contact between the top surface of a copper conductive layer and the bottom surface of an interlayer insulation might not be improved. On the other hand, forming a cover layer thicker than 2.0 $\mu$m might cause an exfoliation of the cover layer from the copper conductive layer when the differences in the thermal expansion coefficients of the two layers is not negligible.

When a cover layer is formed through a plating, the plating resist, which becomes unnecessary, is delaminated after the plating. A part of the groundwork layer beneath the plating resist is removed through an etching process. Consequently, the desired conductive pattern is obtained. A cover layer is preferably insoluble or refractory to the etchant used for dissolving the groundwork layer. This is because a cover layer which is easily dissolved by the etchant might provide insufficient protection to the copper conductive layer. Therefore the cover layer needs to be at least somewhat thicker than the groundwork layer when the cover layer is easily dissolved by the etchant.

In the build-up layer of the wiring board according to this embodiment, a copper conductive layer and an interlayer insulation adhere so tightly to each other via a cover layer sandwiched between them that these two layers do not delaminate easily. Since a copper conductive layer is protected with a cover layer, it is not eroded by the etchant when the groundwork layer is subjected to an etching. Therefore the top surface of a copper conductive layer does not become uneven by an etching. This embodiment forms conductive layer with an excellent appearance.

Figure 9A:
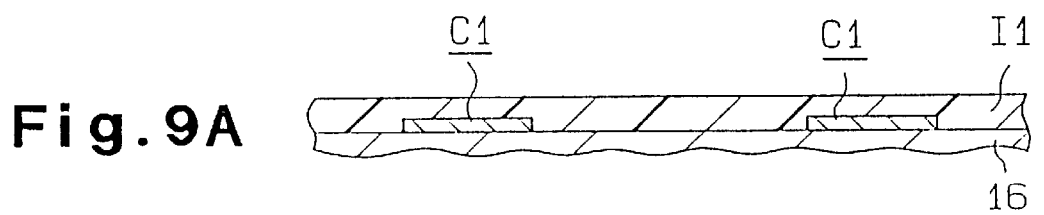
FIGS. 9A, 9B, 9C, 9D, 9E and 9F are sectional views illustrating a sequence of steps for producing a build-up layer in a third embodiment.
Figure 9B:
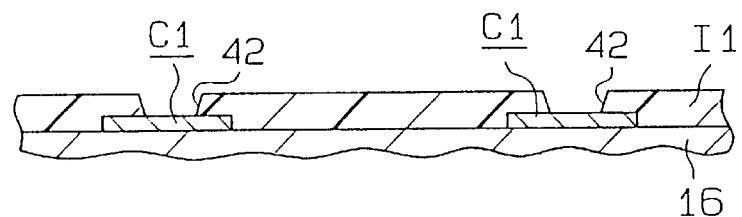
Figure 9C:
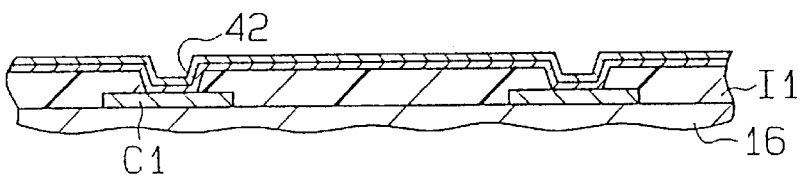
Figure 9D:
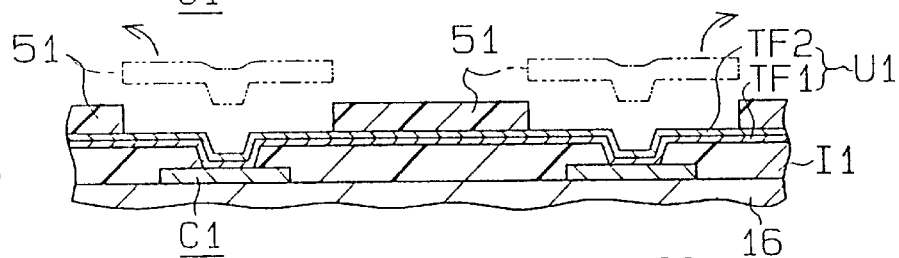
Figure 9E:
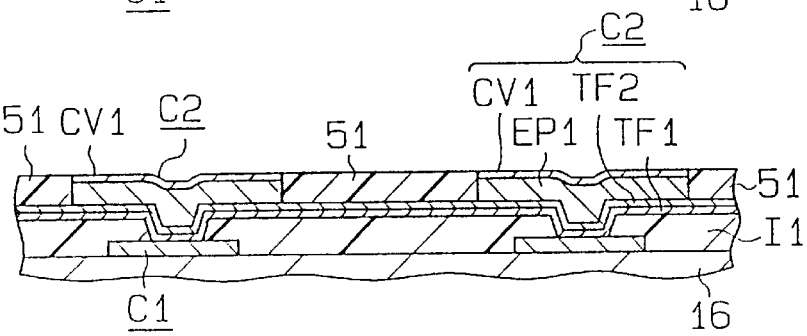
Figure 9F:
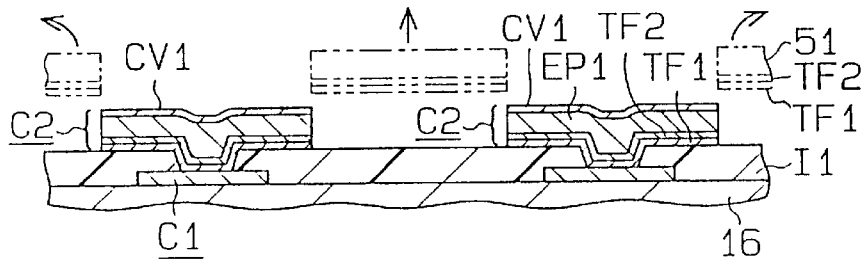
Figure 10:
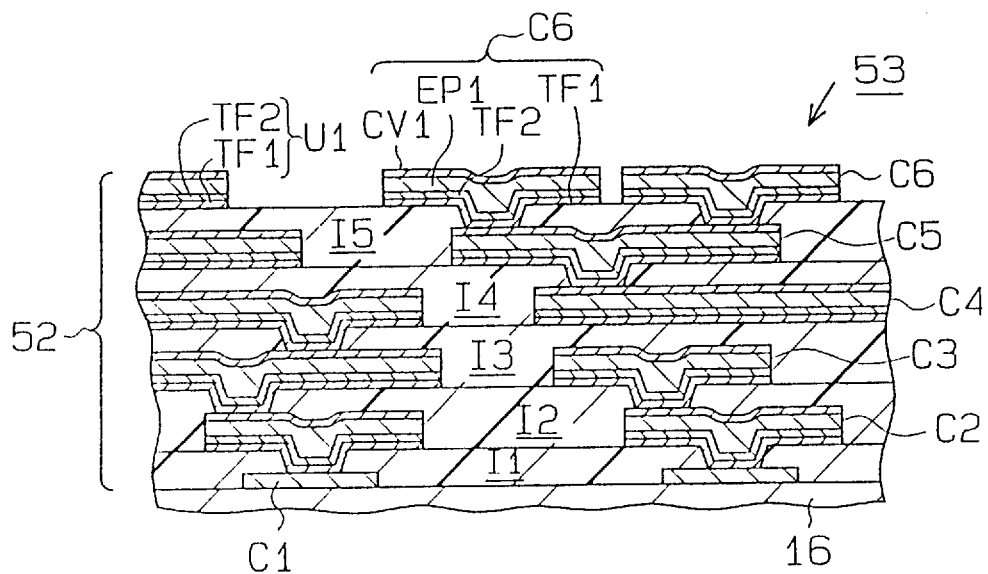
FIG. 10 is a sectional view of a part of the build-up layer in the third embodiment.

A few examples of the embodiment will be described with reference to FIG. 9, FIG. 10, Chart 3 and Chart 4.
Example 1
Step 1: A substrate 16 on which a first conductive layer C1 was formed through sputtering was provided. As shown in FIG. 9A, the varnish of photo-setting resin used to form interlayer insulations I1 to I5 in the second embodiment was applied on a surface of the substrate 16 by the use of a spin coater. The thickness of the varnish was set at 26 $\mu$m.

Step 2: After being pre-baked at 75 degrees centigrade for 30 minutes, the varnish was exposed to light and developed. Then it was cured at 150 degrees centigrade for 60 minutes. As shown in FIG. 9B, the above-mentioned steps formed a 20-$\mu$m-thick first interlayer insulation I1 having holes 42 for forming interstitial via holes measuring 30 $\mu$m in diameter.

Step 3: A 0.1-$\mu$m-thick chrome thin film TF1 as the first metal thin film was formed on the interlayer insulation I1 through chrome sputtering by a vacuum sputtering device (trade name:CFS-8EP, manufactured by Tokuda Seisakusho). Subsequently a 0.2-$\mu$m-thick copper thin film TF2 as the second metal thin film was formed on TF1 through copper sputtering as shown in FIG. 9C. Consequently a 0.3-$\mu$m-thick groundwork layer U1 consisting of two kinds of metals was formed. In this example, the gas pressure of argon of the chrome sputtering was set at 0.8 Pa and the process time was set for 10 minutes. The gas pressure of the copper sputtering was set at 0.8 Pa and the process time was set for 10 minutes.

Step 4: After applying negative type liquid photo resist (trade name: OMR83, manufactured by Tokyo Ouka) on the copper thin film TF2 by a spin coater, the substrate was dried. After being pre-baked, the applied varnish was exposed to light, developed and postbaked. Consequently a 4-$\mu$m-thick plating resist 51 (L/S=20 $\mu$m/20 $\mu$m) shaped like channels was formed as shown in FIG. 9D.

Step 5: After the plating resist 51 was inspected with an optical microscope, the surface of the copper thin film TF2 was activated by dipping the substrate 16 in an aqueous solution of 10% sulfuric acid for 2 minutes.

Step 6: After being washed with water, the substrate 16 was subjected to a copper electroplating by the use of a copper sulfate electroplating bath described below. As shown in FIG. 9E, 3.0-$\mu$m-thick copper electroplating layer EP1 as a copper conductive layer was precipitated on the exposed portion of the copper thin film TF2 from the plating resist 51.

sulfur: 160 to 200 g/l, copper sulfate: 50 to 70 g/l, chlorine ion: 30 to 60 mg/l, brightener: 4 to 10 ml/l, cathode current density: 2.0 A/dm$^2$, temperature: 24 to 26 degrees centigrade, process time: 6 minutes, air: agitated.

Step 7: After being washed with water, the substrate 16 was subjected to a nickel electroplating by the use of a nickel sulfate electroplating bath described below. A 1.0-$\mu$m-thick nickel electroplating layer CV1 as a cover layer was precipitated on the top surface of the copper electroplating layer EP1.

nickel sulfate: 130 to 150 g/l, boric acid: 30 g/l, nickel chloride 25 to 40 g/l, pH=4.0 to 4.5 g/l, cathode current density: 2.0 A/dm$^2$, temperature: 35 to 40 degrees centigrade, process time: 2.5 minutes, air: agitated.

Step 8: The plating resist 51 was delaminated from the substrate 16 with a delaminating liquid (manufactured by Tokyo Ouka) intended for the purpose. The copper thin film TF2 was subjected to an etching with NH$_3$(4.5N)+CuCl$_2$ (150 g/l) as an etchant to dissolve copper. The temperature during the process was set at 25 degrees centigrade and the process time was set at 15 seconds. Further, the chrome thin film TF1 was subjected to an etching with aqueous solution of 50% hydrochloric acid. The temperature during the process was set at 25 degrees centigrade and the process time was set at 25 seconds. Consequently, a conductive layer C2 consisting of the chrome thin film TF1, the copper thin film TF2, the copper electroplating layer EP1 and the nickel electroplating layer CV1 was formed.

Step 9: Repeating the steps 2 to 8 formed conductive layers C3 to C6 and interlayer insulations I2 to I5 sequentially. Eventually a high density ML-PWB 53, which had a buildup layer 52 shown in FIG. 10, was manufactured.

An investigation was carried out to check the High density ML-PWB 53 obtained through the above mentioned steps. The items of the investigation were:

1. The incidence of delaminating of the photo-setting epoxy resin when the photo-setting epoxy resin is developed.
2. The pull strength (kg/mm$^2$) between the conductive layers C2 to C5 and the interlayer insulation formed thereon.
3. The appearance of the conductive layers C2 to C6 in terms of the presence of roughness on the surface.
4. The shape of the conductive layers C2 to C6.
5. The incidence of short and open defects on the conductive layers C2 to C6.

The pull strength of the item 2 was measured with Autograph AGS-50 A manufactured by Shimazu Seisakusho. The results of the investigations are shown in Table 4.

No delamination of the interlayer insulations I2 to I5 was found even when the photo-setting resin was developed. Both the appearance and the shape of the conductive layers C2 to C6 were satisfactory. Neither shorts nor open defects were found on the conductive layers C2 to C6. The measured valise of the pull strength exceeded 1.3 kg/mm$^2$.

According to Example 1, the contact between the top surface of the copper electroplating layer EP1, which consists the conductive layers C2 to C5, and bottom surface of the interlayer insulations I2 to I5 is improved. The conductive layers C2 to C6 according to Example 1 have an excellent appearance and shape. Adopting relatively inexpensive materials and methods such as photo-setting epoxy resin, copper and nickel electroplating realized reduction of the manufacturing cost of the ML-PWB 53.

Example 2

Step 1: By the use of a spin coater, varnish of the photo-setting epoxy resin used in Example 1 was applied to a surface of a substrate 16 on which a first conductive layer C1 was formed. The thickness of the varnish was set at 40 $\mu$m.

Step 2: After being pre-baked at 75 degrees centigrade for 30 minutes, the varnish was exposed to light and developed. Then it was cured at 180 degrees centigrade for 30 minutes. As shown in FIG. 9B, the above-mentioned steps formed a 25-$\mu$m-thick first interlayer insulation I1 having holes 42 for forming interstitial via holes measuring 50 $\mu$m in diameter.

Step 3: A 0.1-$\mu$m-thick chrome thin film TF1 as the first metal thin film was formed on the interlayer insulation I1 through chrome sputtering by the vacuum sputtering device used in Example 1. Subsequently a 0.5-$\mu$m-thick copper thin film TF2 as the second metal thin film was formed on TF1 through copper sputtering as shown in FIG. 9C. Consequently a 0.6-$\mu$m-thick groundwork layer U1 consisting of two kinds of metals was formed. In this example, the gas pressure of argon of the chrome sputtering was set at 0.8 Pa and the process time was set for 10 minutes. The gas pressure of the copper sputtering was set at 0.8 Pa and the process time was set for 25 minutes.

Step 4: After applying negative type liquid photo resist (trade name: AZ4400, manufactured by Hoechst Japan) on the copper thin film TF2 by a spin coater, the substrate was dried. After being pre-baked, the applied varnish was exposed to light, developed and postbaked. Consequently a 0.6-$\mu$m-thick plating resist 51 (L/S=30 $\mu$m/30 $\mu$m) shaped like channels was formed as shown in FIG. 9D.

Step 5: After the plating resist 51 was inspected with an optical microscope, the surface of the copper thin film TF2 was activated by dipping the substrate 16 in an aqueous solution of 10% sulfuric acid for 2 minutes.

Step 6: After being washed with water, the substrate 16 was subjected to a copper electroplating by the use of a copper sulfate electroplating bath described below. As shown in FIG. 9E, 5.0-$\mu$m-thick copper electroplating layer EP1 as a copper conductive layer was precipitated on the exposed portion of the copper thin film TF2 from the plating resist 51.

sulfuric acid: 160 to 200 g/l, copper sulfate: 50 to 70 g/l, chlorine ion: 30 to 60 mg/l, brightener: 4 to 10 ml/l, cathode current density: 2.0 A/dm$^2$, temperature: 24 to 26 degrees centigrade, process time: 11 minutes, air: agitated.

Step 7: After being washed with water, the substrate 16 was subjected to a nickel electroplating by the use of a nickel sulfate electroplating bath described below. A 1.0-$\mu$m-thick nickel electroplating layer CV1 as a cover layer was formed.

nickel sulfate: 130 to 150 g/l, boric acid: 30 g/l, nickel chloride 25 to 40 g/l, pH=4.0 to 4.5 g/l, cathode current density: 2.0 A/dm$^2$, temperature: 35 to 40 degrees centigrade, process time: 2.5 minutes, air: agitated.

Step 8: The substrate 16 was dipped in acetone to delaminate the plating resist 51 therefrom. The copper thin film TF2 was subjected to an etching with $NH_3(4.5N)+CuCl_2$ (150 g/l) as an etchant to dissolve copper. The temperature during the process was set at 25 degrees centigrade and the process time was set at 25 seconds. Further, the chrome thin film TF1 was subjected to an etching with aqueous solution of 50% hydrochloric acid. The temperature during the process was set at 25 degrees centigrade and the process time was set at 25 seconds. Consequently, a conductive layer C2 consisting of the chrome thin film TF1, the copper thin film TF2, the copper electroplating layer EP1 and the nickel electroplating layer CV1 was formed.

Step 9: Repeating the steps 2 to 8 for required times completed the formation a high density ML-PWB 53 having build-up layer 52.

As shown in Table 4, no delamination of the interlayer insulations I2 to I5 was found even when the photo-setting resin was developed. Both the appearance and the shape of the conductive layers C2 to C6 were satisfactory. Neither shorts nor open defects were found on the conductive layers C2 to C6. The measured value of the pull strength exceeded 1.4 kg/mm$^2$, which is better than that of Example 1.

According to Example 2, the contact between the top surface of the copper electroplating layer EP1, which consists the conductive layers C2 to C5, and bottom surface of the interlayer insulations I2 to I5 is improved. The conductive layers C2 to C6 according to Example 2 have an excellent appearance and shape. Adopting photo-setting epoxy resin, copper and nickel electroplating as in the case of Example 1 realized a reduction of the manufacturing cost of the ML-PWB 53.

Example 3

Aluminum was used as the material to form a first metal thin film TF1 instead of chrome. Silver was used as the material to form a second metal thin film TF2 instead of copper. The thickness of TF1 was set at 0.1 μm and that of TF2 was set at 0.2 μm. Photo-setting polyimide was used as the resin material in the varnish to form interlayer insulation I1 to I5 instead of photo-setting epoxy. A copper plating layer EP1 was formed by an electroless deposition. A nickel electroless deposition layer CV1 as a cover layer was formed by an electroless deposition.

As shown in FIG. 4, neither delamination of the interlayer insulations I2 to I5 nor short and open defect on the conductive layers C2 to C6 was found. The appearance and the shape of the surface of the conductive layers C2 to C6 were satisfactory. The measured value of the pull strength was 2.1 kg/mm$^2$, which greatly exceeded the pull strengths of Examples 1 and 2.

Examples 4 to 6

In these Examples, one or more of following items were changed in the ML-PWB 53: the thickness of metal thin films TF1 and TF2, the type of the photosensitive resin used to form the interlayer insulations I1 to I5, the material used to form the cover layer CV1 and the thickness of the cover layer CV1. Each of the ML-PWB 53 of. Examples 4 to 6 were inspected on those same items as those of Examples 1 to 3. The results of the inspections, shown in Table 4, are satisfactory. The measured values of the pull strength of Examples 4 and 6 are particularly good.

Fourth Embodiment

The structure and manufacturing method of the semiconductor package according to the fourth embodiment of the present invention will now be described. In this embodiment the process to manufacture build-up layers is improved for the purpose of realizing a even better contact between interlayer insulations and a conductive layer placed thereon, improving the accuracy of the patterning of conductive layers and facilitating the inspection before the pattern plating.

The build-up layer of the embodiment is constituted by conductive layers and interlayer insulations laminated alternately. Except for the first layer, the conductive layers consist of a groundwork layer constituted by two different metal thin films and a copper conductive layer such as copper plating layer. Therefore the build-up layer of this embodiment has almost the same basic structure as the build-up layer of the 2nd embodiment. However the process to manufacture the build-up layer in this embodiment is different from the process in the second embodiment.

Since the process to form the first conductive layer is the same as that in the second embodiment, only the process to form the other conductive layers and the interlayer insulations will be described.

This embodiment is characterized by the groundwork layer constituted by two thin films of different kinds of metal. A metal, for example chromium, nickel, titanium, molybdenum or tungsten can be selected for forming the first metal thin film. The listed metals are used in improving the contact between the copper conductive layers and interlayer insulations beneath them, and in preventing copper from spreading on the interlayer insulations.

The preferable thickness of the first metal thin film is 0.05 to 0.1 μm. With the thickness made less than 0.05 μm, the metal thin film might function insufficiently to prevent copper from spreading. On the contrary, forming the first metal thin film thicker than 0.1 μm increases the time for sputtering and the manufacturing cost.

The second metal thin film functions to improve the contact between the first metal thin film and the copper conductive layer. A base metal, such as copper, nickel or iron, or a noble metal, such as gold, silver, platinum or palladium can be selected for forming the second metal thin film. Compared with selecting a noble metal, selecting a base metal has an advantage in reducing the manufacturing cost and in facilitating the etching. Selecting copper is particularly preferable.

The preferable thickness of the second metal thin film is 0.05 to 0.2 μm. With the thickness made less than 0.05 μm, the second metal thin film might function insufficiently to improve the contact between the first metal thin film and the copper plating layer. On the contrary, forming the second metal thin film thicker than 0.2 μm increases the time for sputtering and the manufacturing cost.

A guard layer is formed on the second metal thin film in order to protect the groundwork layer. The guard layer is eventually removed through etching and does not remain on the build-up layer. A metal, such as chrome, nickel, titanium, iron, aluminum, molybdenum, tin or copper can be selected for forming the guard layer. All of the above mentioned metals, with the exception of copper, have an advantage in improving the accuracy of patterning due to good contact between the guard layer and the resist. Selecting chrome has an advantage in improving the contact between the guard layer and the resist. Selecting iron or tin has an advantage in facilitating the etching.

The guard layer is preferably formed to a thickness of between 0.1 to 0.3 μm through a dry process such as sputtering. With the thickness made less than 0.1 μm, the guard layer might function insufficiently to remove the residue of sputtering. Forming the guard layer thicker than 0.3 μm greatly increase the time and the manufacturing cost for the process. The guard layer can be also formed through a wet process such as plating. In this case, the preferable thickness of the guard layer is between 0.5 to 3.0 μm. A metal such as nickel, iron, copper and tin is suitable for a wet process. A wet process has an advantage over a dry process in its inexpensive equipment. Table 5 shows examples of combinations of metals to form a metal thin film and a guard layer. A combination having a circle in the box on Table 5 must be selected in this embodiment.

Photo-setting resist is formed partially on the guard layer. The thickness of the photo-setting resist is set at between 2 to 10 μm. The part of the guard layer exposed from the resist pattern is removed by an etching. In this case, the second metal thin film is partially exposed.

$H_2SO_4+H_2O_2$, $H_2SO_4$, HCl, HF, $CuCl_2+NH_3$, $FeCl_3+HCl$ or NaOH can be selected as the etchant to dissolve the guard layer. Table 5 shows etchants usable for a specific combination of metals to form a second metal thin film and a guard layer. In this case a usable etchant for a specific combination means an etchant which dissolves the guard layer without dissolving the second metal thin film.

When the interlayer insulations are transparent or translucent, it is preferable to select a guard layer with at color which is distinguishable from the color of the second metal thin film. Compared with selecting a combination of metals of the substantially same color of different reflection factors, selecting a combination of metals of different colors facilitates the inspection before the pattern plating process. The followings are possible combinations of metals to form a guard layer and a second metal thin film: copper and chrome (silver-colored), copper and tin (silver-colored), silver and copper, gold and chrome (silver-colored). The inspection here means a verification of the non-existence of foreign matter such as resist on the part where the copper plating layer is to be formed, in other words specific part of the second metal thin film is inspected. Remaining resist on the above-mentioned part prevents copper plating from being precipitated and therefore prevents the contact between a copper conductive layer and the interlayer insulation from being improved. The above mentioned etching of the guard layer has the same function as an etching called soft etching in this embodiment, because removing the guard layer includes removing the residues.

On the part where no resist is formed, a copper conductive layer is formed through a wet process such as copper electroplating or copper electroless deposition or through a dry process such as sputtering. After the copper plating is finished, the resist is delaminated. Further the metal thin film beneath the delaminated resist is subjected to an etching with the above mentioned etchant. This process removes the unwanted part of the metal thin film. As a result the second conductive layer constituted by several kinds of metals.

Forming the third and the other conductive layers and interlayer insulations by repeating the above-mentioned process required times completes the build-up layer.

According to this embodiment, the resist is formed on the outermost layer of the guard layer formed on the groundwork layer. Granted that the surface of the substrate is subjected to a soft etching, only the part of the guard layer which is exposed from the resist is removed by the etchant. In this case, the groundwork layer is not removed because it is not; exposed to the etchant. Therefore a soft etching before the pattern plating process becomes possible. Moreover controlling the etching becomes relatively easy. As a result, the residue of the resist is removed without fail. This improves the contact between the copper plating layer and the second metal thin film and also improves the accuracy of the pattern forming. The second metal thin film and the guard layer are formed with metals of different colors. Therefore the distinction between the second metal thin film and the guard layer becomes easy on the basis of reflection factor difference. This means that the verification of whether or not the guard layer is removed from the second metal thin film becomes easy. Therefore the inspection before the pattern plating can be carried out easily and efficiently.

Figure 11:
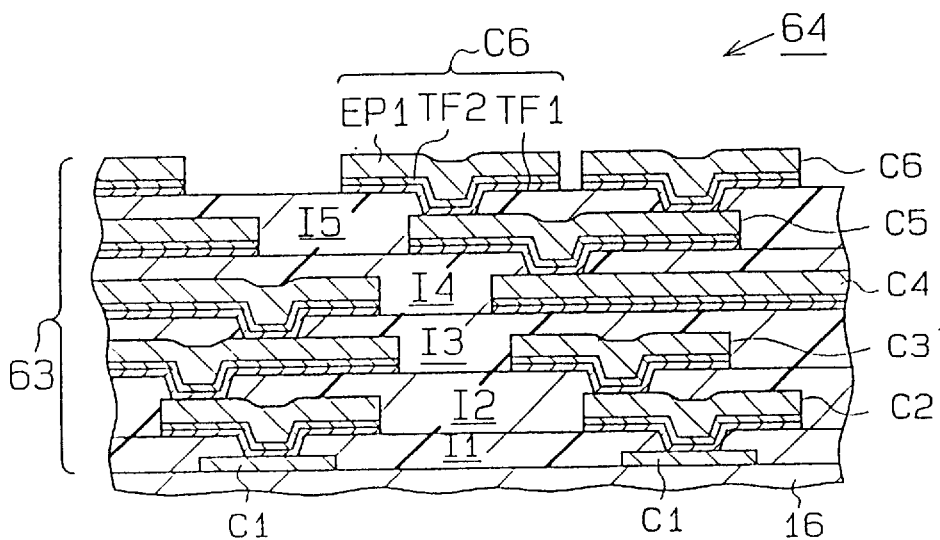
FIG. 11 is a sectional view of a part of a build-up layer in a fourth embodiment.

Some examples of this embodiment will be described with reference to FIG. 11, 12 and Table 16.

Example 1

Figure 12A:
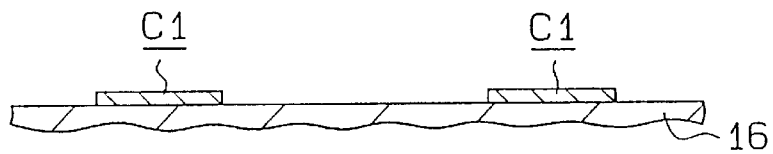
FIGS. 12A, 12B, 12C, 12D, 12E, 12F and 12G are sectional views illustrating a sequence of steps for producing the build-up layer of the fourth embodiment.

Step 1: As shown in FIG. 12A, 0.5-mm-thick substrate 16 with the first conductive layer C1 formed thereon was provided. The varnish of a photo-setting epoxy resin was evenly applied on the substrate 16 through the use of a spin coater. The thickness of the resin was set at 32 $\mu$m.

Figure 12B:
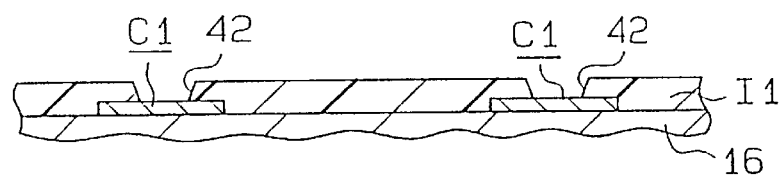

Step 2: After being pre-baked at 75 degrees centigrade for 30 minutes, the varnish was exposed to light and developed. Then it was cured at 150 degrees centigrade for 60 minutes. As shown in FIG. 12B, the above-mentioned treatment formed a 20-$\mu$m-thick first interlayer insulation I1 having holes 42 for forming interstitial via holes measuring 30 $\mu$m in diameter.

Figure 12C:
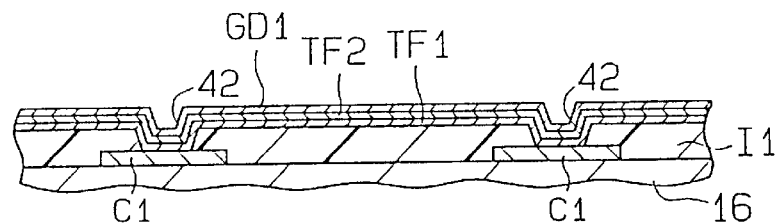

Step 3: A plurality of metals of different kinds was sputtered by a vacuum sputtering device. As shown in FIG. 12C, the sputtering formed a 0.1-$\mu$m-thick chrome thin film TF1 as the first metal thin film, 0.2-$\mu$m-thick copper thin film TF2 and 0.2-$\mu$m-thick chrome thin film GD1 as the guard layer, respectively. The gas pressure of argon of the first chrome sputtering was set at 0.8 Pa and the process time was set for 10 minutes. The gas pressure of the copper sputtering was set at 0.8 Pa and the process time was set for 10 minutes. The gas pressure of the second chrome sputtering was set at 0.8 Pa and the process time was set for 20 minutes.

Figure 12D:
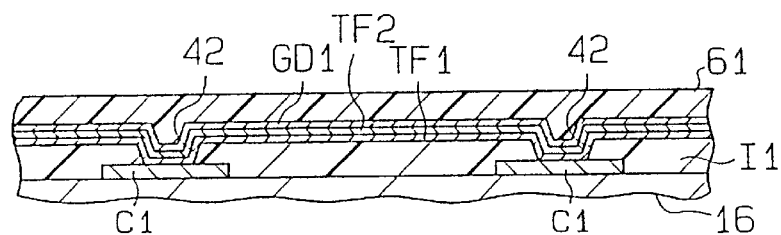
Figure 12E:
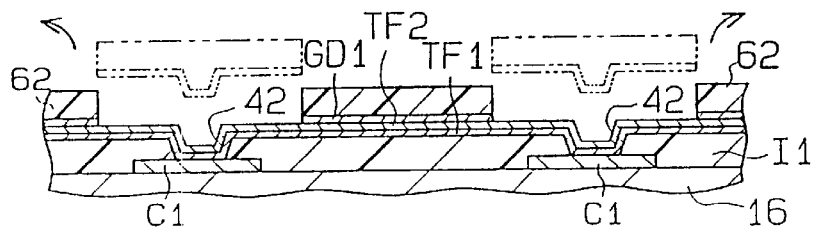

Step 4: As shown in FIG. 12D, liquid photo resist 61(trade name: AZ4210, manufactured by Hoechst Japan) was applied on the chrome thin film L3 by a spin coater. The thickness of the photo resist 61 was set at 10 $\mu$m. After being dried, the applied photo resist 61 was pre-baked, exposed to light, developed and postbaked. Consequently a plating resist 62 (L/S=30 $\mu$m/30 $\mu$m) shaped like channels was formed as shown in FIG. 12E.

Step 5: The substrate 16 was dipped in an aqueous solution of 50% hydrochloric used acid as an etchant to dissolve chrome for 20 minutes. The chrome thin film L3 was removed and the copper thin film TF2 as the second metal thin film was partially exposed. Subsequently the surface of the copper thin film TF2 was inspected through an optical micro scope to verify the result of the etching, in other words, inspection was done to determine whether or not the chrome thin film GD1 was removed completely from the copper thin film TF2. When the result of the etching was unsatisfactory, required correcting was performed before moving on to the next step. When the result was satisfactory, the next step was performed promptly.

Figure 12F:
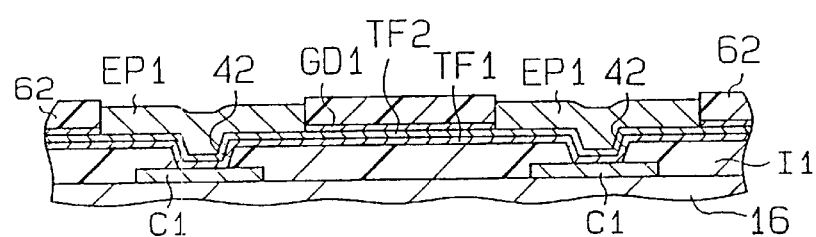
Figure 12G:
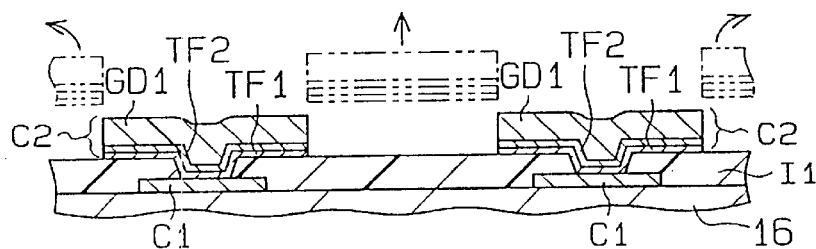
Figure 13:
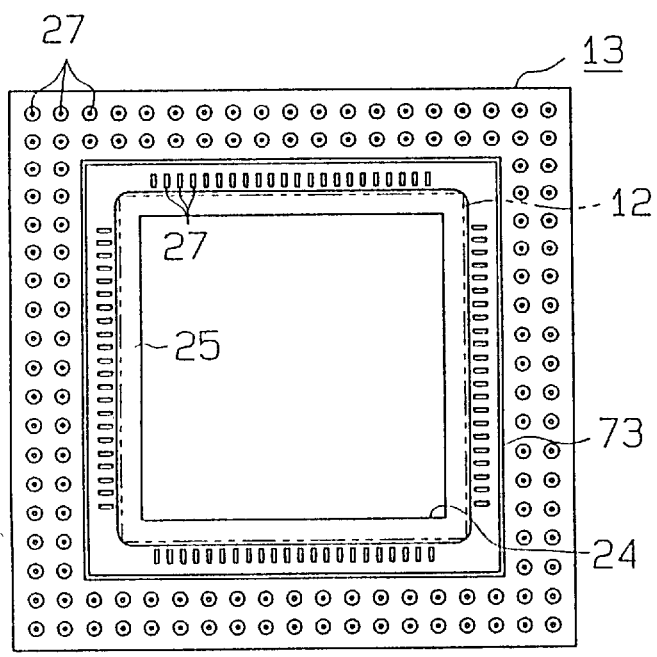
FIG. 13 is a plan view illustrating a supporter used for a semiconductor package of a fifth embodiment.

Step 6: After being washed with water, the substrate 16 was subjected to a copper electroplating through the use of the copper sulfate electroplating bath described below. A 80-$\mu$m-thick copper electroplating layer EP1 as shown in FIG. 12F was precipitated on the part of the copper thin film TF2 exposed from the plating resist 62.

sulfuric acid: 160 to 200 g/l, copper sulfate 50 to 70 g/l, chlorine ion: 30 to 60 mg/l, brightener: 4 to 10 ml/l, cathode current density: 1.0 to 4.0 A/dm$^2$, temperature: 24 to 26 degrees centigrade, process time: 16 minutes.

Step 7: The plating resist 62 was delaminated from the substrate 16 by dipping the substrate 16 in acetone. The chrome thin film GD1 as the guard film was removed through the use of an aqueous solution of 50% hydrochloric acid to dissolve chrome. The copper thin film TF2 was removed through the use of an aqueous solution of $H_2SO_4$+ $H_2O_2$ to dissolve copper. The chrome thin film was removed through the use of the above-mentioned aqueous solution of 50% hydrochloric acid. This formed a conductive layer C2 consisting of three layers, that is the chrome thin film TF1, copper thin film TF2 and copper electroplating layer EP1.

Step 8: Repeating the steps 2 to 7 for required times completed the formation of a high density ML-PWB 64 having build-up layer 63.

An investigation was carried out to check the High density ML-PWB 64 obtained through the above-mentioned steps. The items of the investigation were:

1. The shape of the conductive layers C2 to C6.
2. The pull strength (kg/mm$^2$).
3. The incidence of short and open defects on the conductive layers C2 to C6.

The results of the investigation are shown in Table 6.

An observation through an optical micro scope revealed neither shorts nor open defects on the conductive layers C2 to C6. The shapes of the sections of the conductive layers C2 to C6 were satisfactory. This is because the epoxy resin used to form the interlayer insulations I1 to I5 has good contact with copper. The measured value of the pull strength was 1.9 kg/mm$^2$. Therefore the contact between each of the conductive layers C2 to C6 was satisfactory.

The added thickness of the metal thin films according to this example was only 0.5 $\mu$m. For the sputtering, only two kinds of metals, that is chrome and copper, were required as target materials. These facts contribute to the cost reduction of manufacturing the ML-PWB 64. Further, the inspection through a micro scope before the pattern plating treatment was extremely easy because the copper thin film TF2 and the chrome thin film GD1 had a different reflection factor and color from each other.

Example 2

Step 1: As shown in FIG. 12A, a first conductive layer C1 was formed on a substrate 16 through sputtering and plating. Next, varnish of a photo-setting polyimide resin (trade name: UR-3140, manufactured by Toh-Re) was applied on the substrate 16 by a spin coater. The thickness of the varnish was set at 32 µm.

Step 2: After being pre-baked at 80 degrees centigrade for 90 minutes, the varnish was exposed to light and developed. Then it was cured at 380 degrees centigrade for 30 minutes. As shown in FIG. 12B, the above-mentioned treatment formed a 16-µm-thick first interlayer insulation I1 having holes 42 for forming interstitial via holes measuring 20 µm in diameter.

Step 3: In order of titanium, copper and tin, these metals were sputtered on the interlayer insulations I1 by the above-mentioned vacuum sputtering device. As shown in FIG. 12C, the sputtering formed a 0.1-µm-thick titanium thin film TF1 as the first metal thin film, 0.2-µm-thick copper thin film TF2 and 0.2-µm-thick tin thin film GD1 as the guard layer, respectively. Tin, which was used to form the guard layer GD1, has greater ionization tendency than copper, which was used to form the second metal thin film TF2. In this example, the gas pressure of argon of the titanium sputtering was set at 0.7 Pa and the process time was set for 7 minutes. The gas pressure of the copper sputtering was set at 0.8 Pa and the process time was set for 10 minutes. The gas pressure of the tin sputtering was set at 0.8 Pa and the process time was set for 10 minutes.

Step 4: As shown in FIG. 12D, liquid photo resist (trade name: OMR-83, manufactured by Tokyo Ouka Kabushiki Kaisha) was applied on the tin thin film GD1 by a spin coater. The thickness of the photo resist was set at 10 µm. After being dried, the applied photo resist was pre-baked, exposed to light, developed and postbaked. Consequently a plating resist 62 (L/S=30 µm/30 µm) shaped like channels was formed as shown in FIG. 12E.

Step 5: The substrate 16 was dipped in an aqueous solution of 20% hydrochloric acid used as an etchant to dissolve tin for 40 seconds. The tin thin film GD1 was removed and the copper thin film TF2 as the second metal thin film was partially exposed as shown in FIG. 12E. Subsequently the surface of the copper thin film TF2 was inspected through an optical micro scope.

Step 6: After being washed with water, the substrate 16 was subjected to a copper electroplating through the use of the copper sulfate electroplating bath used in Example 1. A 4.0-µm-thick copper electroplating layer EP1 as shown in FIG. 12F was precipitated on the part of the copper thin film TF2 exposed from the plating resist 62.

Step 7: The plating resist 62 was delaminated from the substrate 16 by dipping the substrate 16 in a delaminating agent (trade name: OMR hakurieki). In order of the tin thin film GD1, the copper thin film TF2 and the titanium thin film TF1, the metal thin films were removed through etching. An aqueous solution of $H_2SO_4+H_2O_2$ was used for dissolving copper.

An aqueous solution of fluorine was used for dissolving titanium. An aqueous solution of hydrochloric acid was used for dissolving tin. This formed a conductive layer C2 consisting of three layers, that is the titanium thin film TF1, copper thin film TF2 and copper electroplating layer EP1.

Step 8: Repeating the steps 2 to 7 for required times completed the formation of a high density ML-PWB 64 having build-up layer 63.

An observation through an optical micro scope revealed neither shorts nor open defects on the conductive layers C2 to C6 as shown in Table 6. The shapes of the sections of the conductive layers C2 to C6 were satisfactory. The measured value of the pull strength was 2.5 kg/mm$^2$, which is better than that of Example 1. Therefore the contact between each of the conductive layers C2 to C6 was satisfactory. Further, the inspection through a micro scope before the pattern plating treatment was extremely easy because the copper thin film TF2 and the tin thin film GD1 had a different reflection factor and color from each other.

Examples 3 to 8

As shown in Table 6, In these Examples, one or more of following items were changed in the ML-PWB 64: the type of metal to form the first metal thin film TF1, the type of metal to form the second metal thin film TF2, the type of metal to form the guard layer GD, and the type of the photo-setting resin to form the interlayer insulations I1 to I5. The ML-PWB 64s of Examples 3 to 8 were inspected. The results of the inspections are as satisfactory as those of Examples 3 to 8. The measured values of the pull strength of Examples 3, 4, 7 and 8 were particularly good.

In this embodiment the following modifications are also permissible.

One modification is to select nickel to form the first metal thin film TF1 and copper to form the second metal thin film TF2. In this case, both metal thin films can be subjected to an etching by the same etchant (e.g. $HNO_3+H_2O_2$) at the same time. This combination of metals therefore is preferable for simplifying the manufacturing process. Other possible combinations for the simultaneous etching are copper-iron, iron-nickel and nickel-silver.

A cover layer CV1 described in the third embodiment can be formed with nickel or the like on the surface of the copper electroplating layer EP1.

Fifth embodiment

The semiconductor package according to the fifth embodiment of the present invention will now be described with reference to FIGS. 13 to 16. The configuration of the supporter 13 was modified in accordance with the sealing by a potting compound 72.

The multi-chip career comprised in the semiconductor package 71 according to this embodiment consists of the supporter 13, which is substantially of pin grid array (PGA) type, and a wiring board 12 to be mounted thereon. The multi-chip career and a plurality of LSI chips 14 and 15 mounted thereon comprise a multi-chip module (MCM). Since the supporter 13 and the high density multi-chip printed wiring board 12 in this embodiment have substantially the same structure as those in the first embodiment, no detailed description thereof is given here. The build-up layer 17 on the ML-PWB 13 can have the same structure as that of the build-up layer 17 described in the second and fourth embodiments.

Figure 14:
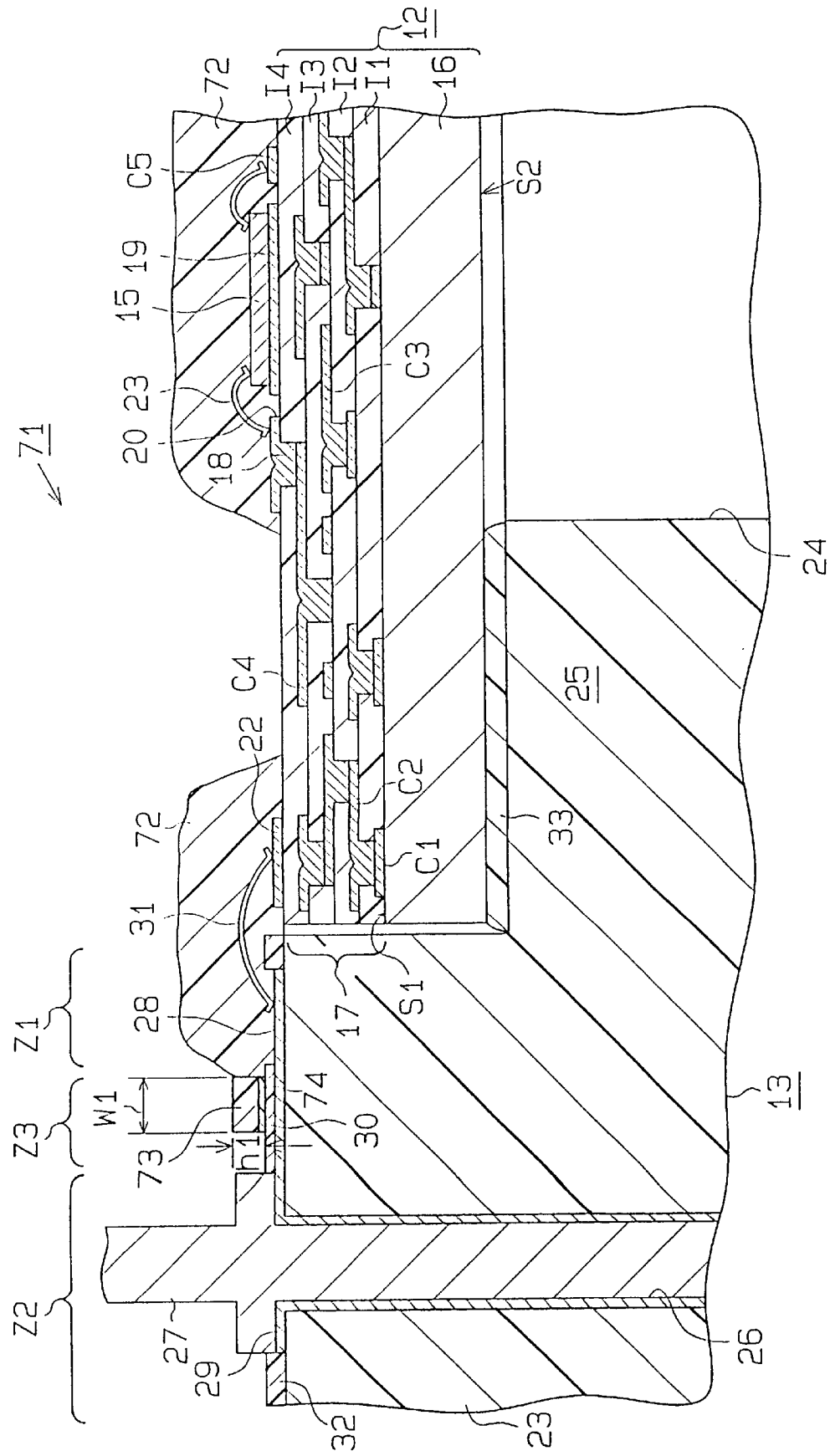
FIG. 14 is an enlarged sectional view illustrating a part of the semiconductor package of the fifth embodiment.
Figure 15:
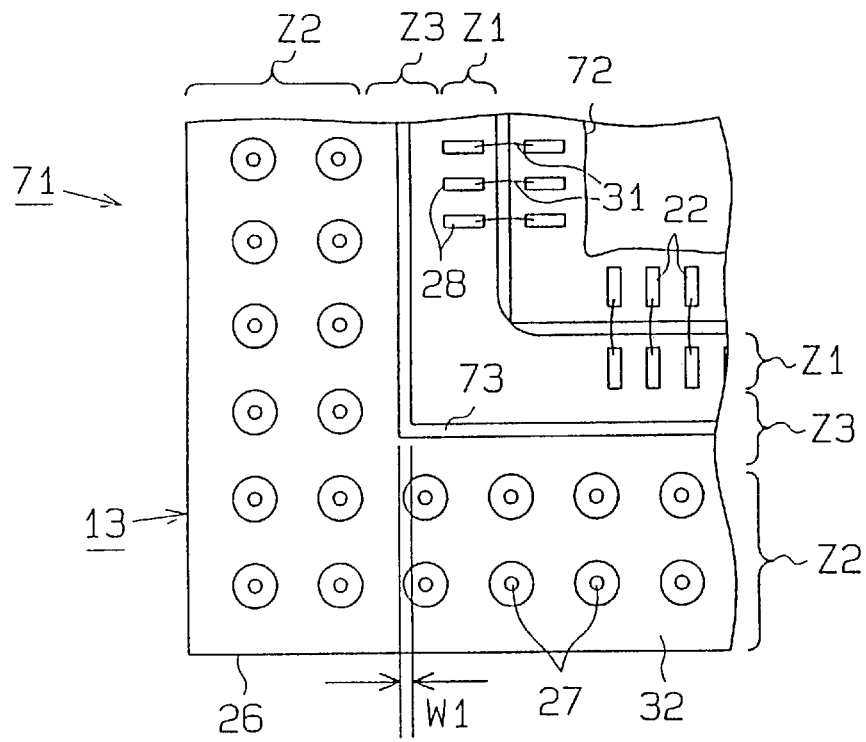
FIG. 15 is a plan view illustrating a part of the semiconductor package shown in FIG. 14.
Figure 16:
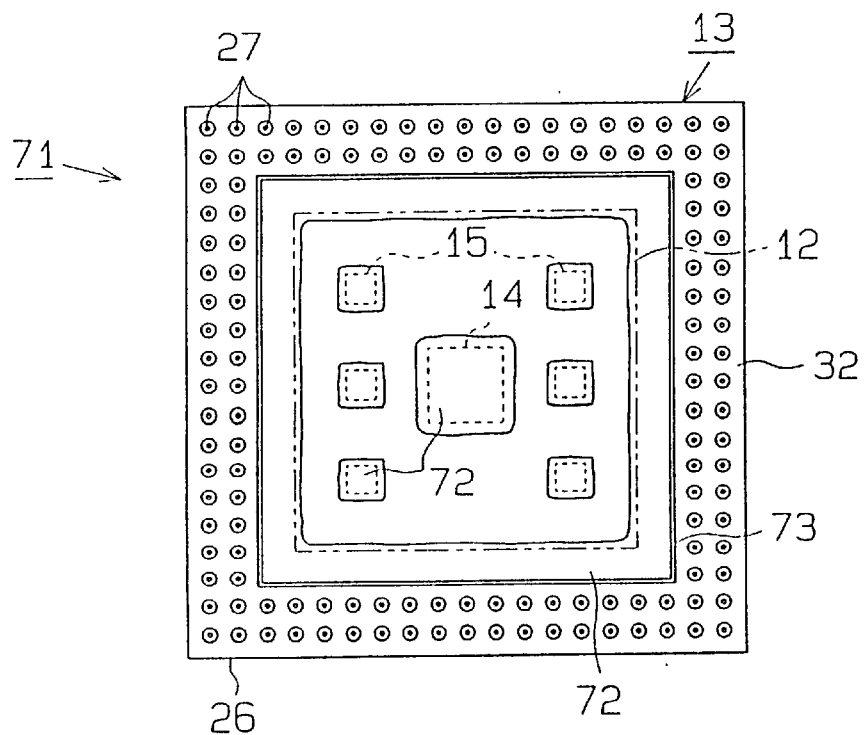
FIG. 16 is a schematic plan view illustrating the semiconductor package shown in FIG. 14.

As shown in FIGS. 14 to 16, the semiconductor package 71 has the part connecting the LSI chips 14 and 15 to the ML-PWB 12 and the part connecting the ML-PWB 12 to the supporter 13. The part connecting the LSI chips 14 and 15 to the ML-PWB 12 constitutes bonding pads 20, the terminals on the LSI chips 14 and 15 (not shown) and bonding wires 23 connecting the bonding pads 20 to the terminals. The part connecting the MLPWB 12 to the supporter 13 constitutes bonding pads 28, I/O pads 21 and bonding wires 31 connecting the boding pads 28 to the I/O pads 21. These parts are sealed with the potting compound, respectively. It is permissible to seal these parts altogether. An epoxy resin (trade name: CCN 2001–23P, manufactured by Kyushu Matsushita), whose viscosity of 1500 to 25000 cps, was used as the potting compound 72 in this embodiment.

The peripheric portion of the supporter 13, which has a rectangular and belt-like shape, where the I/O pins are formed is defined as a second zone Z2. The zone where the bonding pads 28 are formed is defined as a first zone Z1. The first zone Z1 is located inside the second zone Z2. The zone lying between the zones Z1 and Z2 is defined as a third zone Z3. The width of the third zone Z3 is 2 to 5 mm in this embodiment.

A square dam frame 73 for stopping the flow of the potting compound 72 is glued to the third zone Z3 via an adhesive sticker 74. The material to form the dam frame 73 is preferably the same as the material chiefly used to form the double-sided board 23 for the supporter 13. An epoxy resin is selected as the material to form the double-sided board 23 and the dam frame 73 in this embodiment. The width w1 of the dam frame is set greater than the width of the third zone Z3, preferably at 0.5 to 5.0 mm, more preferably at 1.0 to 3.0 mm. With the width w1 set too great, the dam frame 73 cannot be glued to the third zone Z3. In contrast, with the width w1 set too small, the dam frame 73 becomes prone to deformities because its stiffness is deteriorated and difficult to handle in the adhesion process.

The height h1 of the dam frame 73 adhered to the third zone Z3 is set greater than at least 0.1 mm, preferably between 0.15 to 3.0 mm, more preferably between 0.5 to 1.0 mm. With the height h1 set too small, the dam frame 73 might be incapable of stopping the flow of the potting compound 72 completely. In contrast, with the height h1 set too great, the dam frame might hinder the operations of mounting parts on the mother board MB1 and wire-bonding. Preferably, the greater the viscosity of the potting compound 72 becomes, the smaller the height of the dam frame 73 becomes and vice versa.

The dam frame 73 in this embodiment has the adhesive sticker 74 glued on the bottom surface thereof and a protect sheet attached on the adhesive sticker 74. To glue the dam frame 73 to the third zone Z3, the bottom surface of the dam frame 73 is pressed against the third zone Z3 after the protect sheet is peeled off the adhesive sticker 74. The adhesive sticker 74 is completely cured through a curing treatment at 150 degrees centigrade for 60 minutes. After wire-bonding is performed, a potting with the potting compound 72 is performed according to the ordinary procedure. The dam frame 73 can be glued to the third zone Z3 in the manufacturing process of the supporter 13 and also after the ML-PWB 13 is attached to the supporter 13. However the dam frame 73 is preferably glued to the third zone Z3 before the wire-bonding to reduce the possibility of deforming the bonding-wires.

Sealing the electrical connecting parts with the potting compound 72 ensures high reliability of the semiconductor package 71 according to this embodiment. The dam frame 73 as a dam structure is glued to the third zone Z3. This means that there is a protuberance for stopping the flow of the potting compound 72 from the first zone Z1 to the second zone 2. Therefore the potting compound 72 flowing toward the second zone Z2 is blocked by the dam frame 73. Consequently the outline of the potting compound 72 becomes square with straight lines in accordance with the shape of the dam frame 73. Therefore the appearance of the semiconductor package 71 is better than that of conventional semiconductor packages.

Since uneven flows of the potting compound 72 are prevented, the variations of electrical resistance does not occur. This ensures the improvement of the electrical characteristic of the semiconductor package 71. The prevention of the uneven flow of the potting compound 72 to the second zone Z2 also means that the I/O pins 27 are free from the depositing of the potting compound 72. Therefore the semiconductor package 71 can be mounted to the mother board MB1 with reliability.

On a conventional semiconductor package, the width of the third zone Z3 is widened to obtain a greater distance from the first zone 1 to the second zone 2. Since no measurement like this has to be taken, the semiconductor package 71 need not be upsized.

The dam structure of this embodiment can be formed very easily by gluing the dam frame 73 to the third zone Z3. Since the dam frame 73 has a fixed shape, variations of its width w1, height h1 and shape are extremely small. This ensures the improvement of the outer appearance of the entire semiconductor package 71.

In this semiconductor package 71, epoxy resin is used as the chief material of the double sided board 23, the material of the potting dam frame 73 and the material of the potting resin 72. The thermal expansion coefficient of 23, 73 and 72 approximates to one another. Even when the semiconductor package receives a thermal shock, no exfoliation occurs at the interface between them, which means the thermal characteristic of the semiconductor package 71 is good.

The followings are possible modifications of this embodiment.

1. The dam structure can be constructed by four straight bars glued to the third zone Z3. In this case, the straight bars do not have to stick to one another to form a dam frame with a continuous structure. This means the dam structure can be omitted at the part of Z3 having no I/O pin nearby.

2. The dam frame 73 can be glued to the third zone Z3 not only with solid adhesive sticker 74 but also with semi-solid adhesive. Or, rather than using the adhesive sticker 74 or adhesive, ink for printing can be printed on the third zone Z3 repeatedly. The ink is printed after the solder resist 32 is formed.

3. The sealing of the package can be done with the following procedure. First, a mold is placed around the third zone Z3, that is to say, on the second zone Z2. The mold preferably has a surface which peels off easily when sticking to something. Next, the potting resin 72 is provided on the predetermined part and set by heat. Then only the mold is removed from the double sided board 23. According to this method, the mold serves as a dam structure when the potting resin 72 is provided to the board 23 so that the flow of the potting resin 72 to the second zone Z2 is blocked.

4. The area surrounding the third zone Z3 can be elevated to function as a dam structure.

5. Pins for fixing can be formed on the bottom surface of the dam frame 73 and the dam frame 73 can be attached to the supporter 13 with its pins inserted into the plated through holes of the supporter 13. A groove can be formed on the third zone Z3, and the dam frame 73 can be attached to the supporter 13 with a part fit into the groove.

6. For example, bismaleimide-triazine resin, polyimide resin, silicon resin, fluorine resin or whatnot can be selected to form a dam frame 73. Other than the resins listed above, a metal or ceramic such as copper aluminum, nickel, Kovar or the like can be selected. The material to form the dam frame 73 does not have to be the same as the material used to form the double sided board 23.

Sixth embodiment

A semiconductor package 81 according to the sixth embodiment of the present invention will now be described with reference to FIGS. 17 to 21. The semiconductor package 81 has its electrical connecting part hermetically sealed with potting resin 72 and a cap 82.

The multi-chip carrier included in the semiconductor package 81 according to this embodiment consists of the supporter 83, which is substantially of pin grid array (PGA) type, and a wiring board 12 mounted thereon. The multi-chip career and a plurality of LSI chips 14 and 15 hermetically mounted thereon and sealed with the potting resin 72 and the cap 82 comprise a multi-chip module (MCM). Since the ML-PWB 12 in this embodiment has substantially the same structure as that in the first embodiment, no detailed description thereof is given here. The build-up layer 17 on the ML-PWB 12 can have the same structure as that of the build-up layer 17 described in the second and fourth embodiments.

The supporter 83 of the semiconductor package 81 has a different structure from the supporters of the first and fifth embodiments. The supporter 83 of this embodiment comprises a printed wiring board whose chief component is copper clad laminate made of bismaleimide-triazine resin. The printed wiring board is a four-layered board 84 having four conductive layers. This is the main dissimilarity between this embodiment and the first or fifth embodiment.

Figure 19:
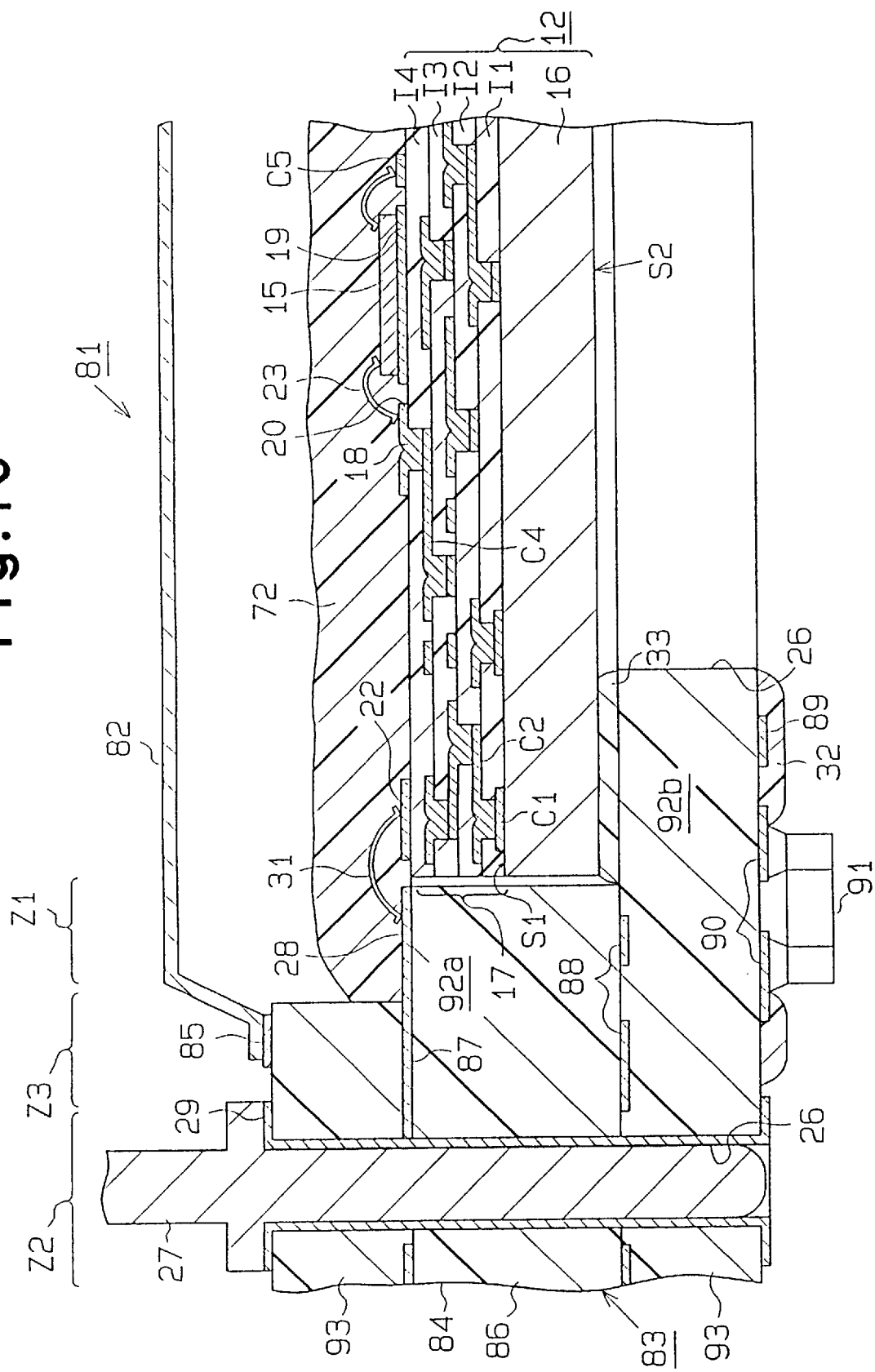
FIG. 19 is an enlarged sectional view illustrating the semiconductor package of the sixth embodiment.

As shown in FIG. 19, the first conductive layer formed on the front surface (top surface in FIG. 19) of the four-layered board 84 consists of the land 29 of the plated through holes 26 and a square sealing pattern 85. Internal conductive layers 87 and 88 as the second and third conductive layers are formed on the both surface of a core board 86 of the four-layered board 84. The fourth conductive layer formed on the bottom surface of the four-layered board 84 consists of the land of the plated through holes 26, a ground pattern 89 of the predetermined shape and pads 90 as conductive patterns for mounting electronic parts. The semiconductor package according to this embodiment has three pairs of the pads 90. The bottom surf ace is partially covered with solder resist 32 Electronic parts 91 such as a decoupling capacitor as shown in FIG. 19 are soldered to the part of pads 90 exposed from the solder resist 32.

The second conductive layer from the top surface serves as a signal layer. The third layer serves as a power supply layer. A part of the fourth layer serves as a ground layer. The four-layered board 84 according to this embodiment is manufactured through the conventional subtractive process. The thickness of the core board 86 is approximately 1.5 mm The L/S of a conductive layer is 125 $\mu$m/125 $\mu$m and its height
is 38 $\mu$m.

Figure 17:
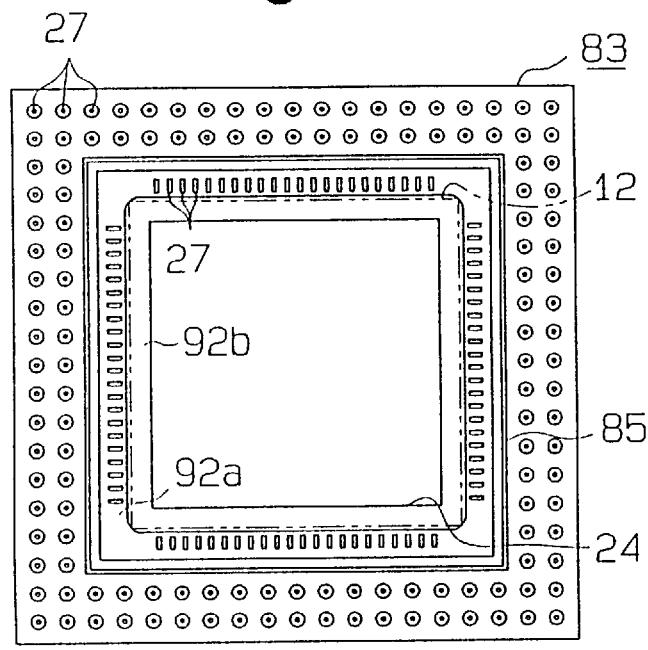
FIG. 17 is a plan view illustrating a supporter used for a semiconductor package of a sixth embodiment.
Figure 18:
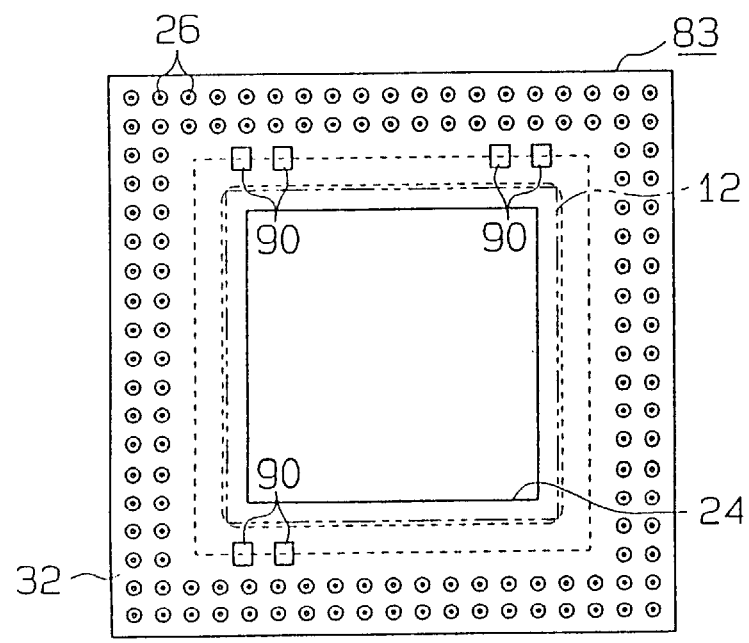
FIG. 18 is a bottom view of the supporter shown in FIG. 17.

As shown in FIGS. 17 and 18, a window 24 of the four-layered board 84 is surrounded by a host of plated through holes 26. I/O pins 27 are implanted in the through holes 26.

Steps 92a and 92b are formed on the inner wall of the window 24. The first step 92a is between 0.5 to 1.0 mm lower than the top surface of the four-layered board 84. Rectangular bonding pads 28 are regularly laid out on the top surface of the first step 92a so as to surround the window 24. Each bonding pad 28 is electrically connected to a plated through holes 26 via the internal conductive layer 87.

The difference of the heights of the top surface and the first step 92a *has to be at least* 0.3 mm, preferably between 0.5 to 1.0 mm. If the difference is too small, it might not function to stop the flow of the potting resin 72 with reliably.

In contrast, if the difference is too big, although the flow of the potting resin 72 is stopped effectively, the package 81 becomes too thick. With these points considered, the difference in this embodiment is set at 0.5 mm.

The second step 92b is formed inside the first step 92a. The height of the top surface of the second step 92b is relatively lower than the first step 92a. More concretely, the difference of the heights is set at 1.1 mm which is substantially equal to the thickness of the ML-PWB 12. The second step 92b supports the periphery of the ML-PWB 12 when fit into the window 24. The height of the build-up layer 17 on the ML-PWB 12 is substantially equal to the height of the top surface of the first step 92b, which means that the height of the I/O pads 21 on the build-up layer 17 is substantially equal to the height of the bonding pads on the supporter 83. As shown in FIG. 17, each of the I/O pads are electrically connected to a bonding pad 28 respectively via a bonding wire 31. A plurality of the electrically connecting parts on the build-up layer 17 is sealed thoroughly with the potting resin 72 which was used in the fifth embodiment.

As shown in FIGS. 17 and 19, the sealing pattern 85 formed on the top surface of the ML-PWB 12 surrounds the window 24. A cap 81 made of a metal of superior conductivity such as Kovar is soldered on the surface of the sealing pattern 85. The cap 81 covers the entire area sealed with the potting resin 72. The cap 81 can be formed not only with metal but also with ceramic.

The supporter 83 according to this embodiment is manufactured through the following process. First, the central part of a copper clad laminate (50 mm square, 1.7 mm) made of bismaleimide-triazine is countersunk to form a 31 mm square hole. A square through hole is formed through the above mentioned process. After placing plating resist on the predetermined part, the ML-PWB 17 is subjected to a copper electroplating so as to precipitate copper on the required part. Then the plating resist is delaminated and the unwanted copper is subjected to etching. The etching forms the signal layer and power supply layer (internal conductive layers 87 and 88 and the bonding pad 28). The internal conductive layer 86 is manufactured through subtractive process. Prepregs 93 made of bismaleimide-triazine are laminated on the both surface of the internal conductive layer 86 as shown in FIG. 20. The prepregs 93 are in the B stage, and a copper leaf is pasted on one side of each prepreg 93. The thickness of each prepreg is between 0.1 to 0.3 mm. The internal conductive layer 86 is subjected to piercing to form holes for forming plated through holes.

Figure 20A:
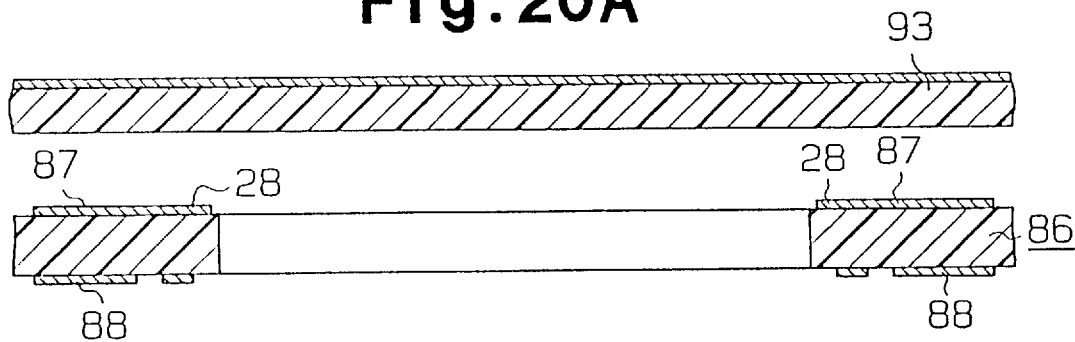
FIGS. 20A, 20B, 20C, and 20D are sectional views illustrating a sequence of steps for producing the semiconductor package shown in FIG. 19.
Figure 20B:
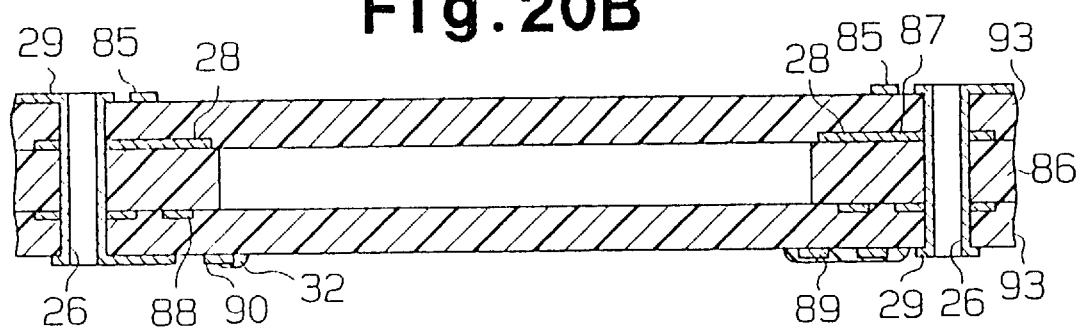
Figure 20C:
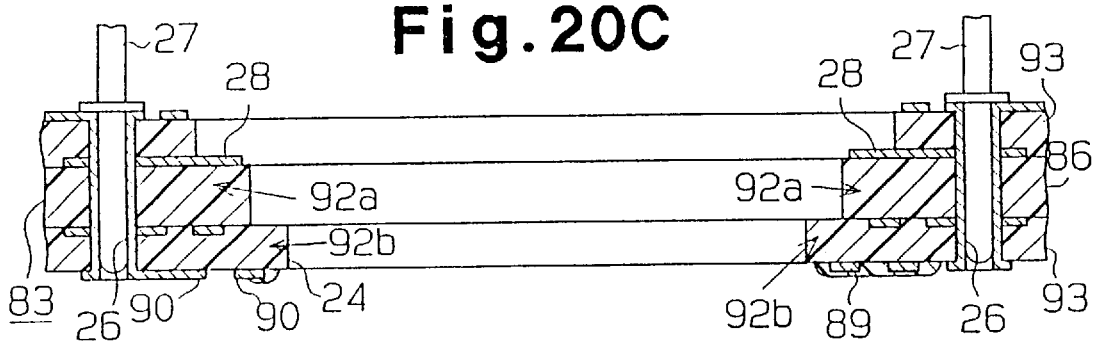

After the placing of the plating resist, copper electroplating is performed to precipitate copper on the required part. Then the plating resist is delaminated and unwanted copper is subjected to etching. This etching forms the lands 29, the sealing pattern 85, the ground patterns 89 and the pads 90 as shown in FIG. 20B. The I/O pins 27 are inserted in the plated through holes 26 after forming solder resist 32 on the bottom surface. The prepreg 93 on the top surface is countersunk to form the first step 92a and to expose the bonding pads 28. The prepreg 93 on the bottom surface is countersunk to form the second step 92b and to form the window 24. Lastly, the countersunk surfaces are subjected to dicing as shown in FIG. 20C. After an open/short defective test is performed, the adhesive sticker 33 is placed on the top surface of the second step 92b.

Figure 20D:
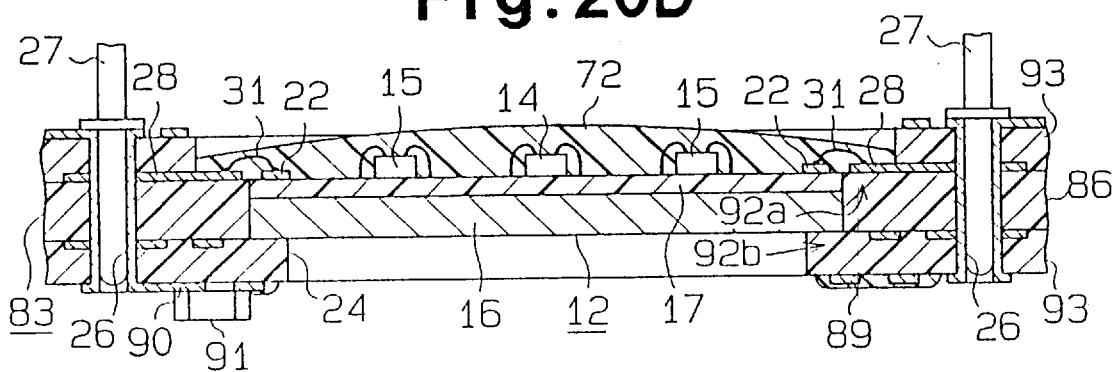

After the supporter 83 and the ML-PWB 12 are glued provisionally via the adhesive sticker 33, the adhesive sticker 33 is cured at 150 degrees centigrade for 60 minutes to be set completely. Then diebonding, wirebonding and sealing by the potting resin 72 are performed as shown in FIG. 20D. Lastly, the cap 81 is soldered to the sealing pattern 85 and the manufacturing of the semiconductor 81 shown in FIG. 19 is completed.

In the semiconductor package 81 according to this embodiment, the supporter 83 comprises the four-layered board 84. Among the four conductive layers consisting the four-layered board 84, one layer is the ground layer and another is the power supply layer. The semiconductor package 81 has a lower parasitic parameter (capacitance of parasitic added to the signal wire) than packages without ground layer or power supply layer. Therefore the delay of the signals' standing up speed is prevented when reliability and the electrical characteristic of the semiconductor package 81 is improved. As a result, the semiconductor package 81 has higher performance, value and reliability.

Since the supporter 83 has a ground layer and power supply layer, the ML-PWB 12 needs no ground layer or power supply layer in it. Therefore the number of the interlayer insulations I1 to I4 and the conductive layers C1 to C5, which consist the build-up layer 17, can be reduced. If the number of the layers consisting the build-up layer 17 stays, layers functioning as a ground layer and a power supply layer can be allocated for functioning as conductive layers. Building no ground layers or power supply layers in the build-up layer 17 enables the moisture contained in the interlayer insulations to exit therefrom. This also contributes to the improvement of the function of the semiconductor 81.

The four-layered board 84 in the supporter 83 according to this embodiment is manufactured through a subtractive process. Adopting a four-layered board 84 makes manufacturing the supporter 83 relatively easy and inexpensive compared with adopting a multi-layered board manufactured through additive process or the like. This is advantageous for reducing the manufacturing cost of the semiconductor package 81. The core board 86 and the prepregs 93 laminated on both surfaces thereof constitute the four-layered board 84. A printed wiring board of this structure is less vulnerable to warping stress than a printing wiring board having a prepreg only on one surface. The supporter 83 according to this embodiment does not become deformed by heat.

Devices 91 are mounted on the supporter 83 in the semiconductor package 81 according to this embodiment. Therefore no pads to mount the devices have to be formed on the build-up layer 17. This structure reduces the area and the number of layers of the build-up layer 17. Therefore the size and cost of the semiconductor package 81 are reduced. In this embodiment, a decoupling capacitor as a device 91 is mounted on the supporter 83 via the pad 90. The decoupling capacitor reduces the influence of the inductance accompanying the parasitic parameter of the semiconductor package 81.

The two steps 92a and 92b are formed on the inner wall of the window 24 and the bonding pads 28 are laid out on the surface of the first step 92a. The height of the surface where bonding pads are formed is relatively lower than the top surface of the four-layered board 84. Therefore the flow of the potting resin 72 to the second zone Z2 is blocked by the inner wall of the window 24. The outline of the potting resin 72 is defined by the shape of the window 24 and consists straight lines. Consequently the whole package 81 has a superior appearance to that of a conventional package.

This structure prevents uneven flows of the potting resin 72. Therefore variations of electrical resistance of the semiconductor package 81 are also prevented. Thus, the electrical characteristic of the semiconductor package 81 is improved. The prevented uneven flows of the potting resin 72 of course do not touch the I/O pins 27. Therefore the semiconductor package 81 is mounted firmly on the mother board MB1.

Since uneven flows of the potting compound 72 are prevented, the variations of electrical resistance do not occur. This ensures the improvement of the electrical characteristic of the semiconductor package 81. The prevention of the uneven flow of the potting compound 72 to the second zone Z2 also means that the I/O pins 27 are free from the depositing of the potting compound 72. Therefore the semiconductor package 81 can be mounted to the mother board MB1 with reliability. On a conventional semiconductor package, the width of the third zone Z3 is widened to obtain a greater distance from the first zone 1 to the second zone 2. Since no measurement like this has to be taken, the semiconductor package 81 does not need to be upsized. Thus the semiconductor package 81, which has superior electrical characteristics, can be realized by adopting the structure according to this embodiment without raising the manufacturing costs.

The following modifications of this embodiment are permissible.

Figure 21:
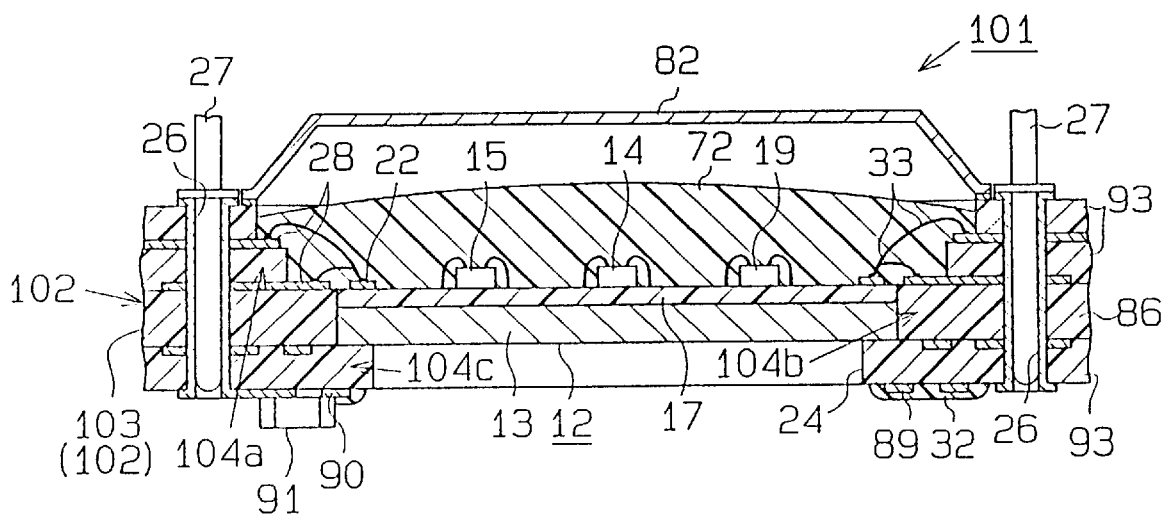
FIG. 21 is a sectional view illustrating a modification of the semiconductor package shown in FIG. 14.

1. As shown in FIG. 21, in the semiconductor package 101, a five-layered board 103 is used as the printed wiring board consisting of the supporter 102. In the five-layered board 103, the second and third layers from the top surface are used. as wiring layers and the fourth and fifth layers are used as power supply layers. Three steps 104a, 104b, 104c are formed on the inner wall of the window 24 of the five-layered board 103. The second step 104b is located inside the first step 104 and the third step 104c is located inside the second step 104b. Bonding pads 28 are laid out on the top surface of the first and second steps 104a and 104b.

2. The number of layers in the printed wiring board used in the supporter 81 and 102 can be 3 or 5. It is permissible to make a plurality of layers power supply layers or ground layers. Adopting these structures leads to further improvement of the electrical characteristic of the semiconductor package.

3. A device 91 to be mounted includes a passive component such as chip capacitor, a chip resistor and a chip coil, and an active component such as a chip diode and chip transistor. Either a surface mount device as mentioned above or a through-hole mount device can be mounted on a pad 90.

4. A hole of the size substantially same as the device 91 can be formed on the bottom surface of the supporter 83 and a pair of pads 90 can be formed on the bottom thereof. The device 91 can be fit into the hole and be soldered. This structure contributes to making the semiconductor package 81 even thinner.

5. A conductive layer having a function other than a wiring, ground or power supply layer can be formed in the supporter 83. For example, a conductive layer for magnetic sealing can be formed.

6. The pads 90 can be formed on the peripheral portion outside the plated through holes 26. The lands 29 of the plated through holes 26 can be used as the pads 90. The pads 90 can be formed on the top surface of the side surf ace of the supporter 83.

7. The plated through holes can be landless. This structure saves a lot of space on the bottom surface for forming the pads 90 and the ground pattern 89.

Seventh embodiment

The semiconductor package 111 according to the seventh embodiment of the present invention will now be described with reference to FIGS. 22 to 29. The semiconductor package 111 is not of a pin grid array type like the semiconductor packages according to first to sixth embodiment. It is a quad flat package, which has a plurality of leads on the four side surfaces.

Figure 22A:
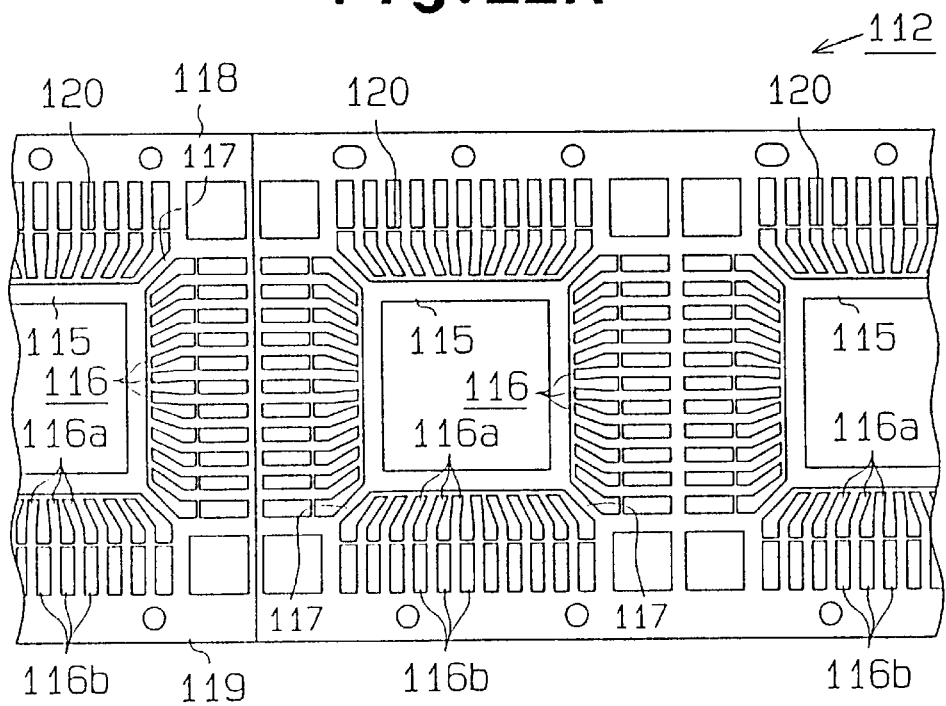
FIG. 22A is a plan view of a part of a lead frame used for a semiconductor package of a seventh embodiment.
Figure 22B:
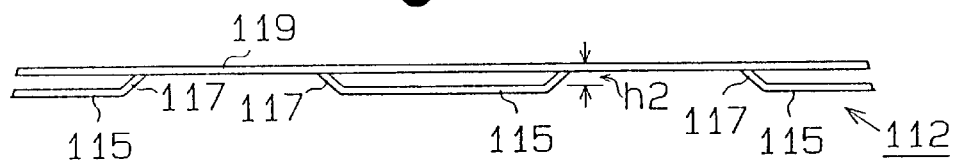
FIG. 22B is a front view of the lead frame shown in FIG. 22A.
Figure 23:
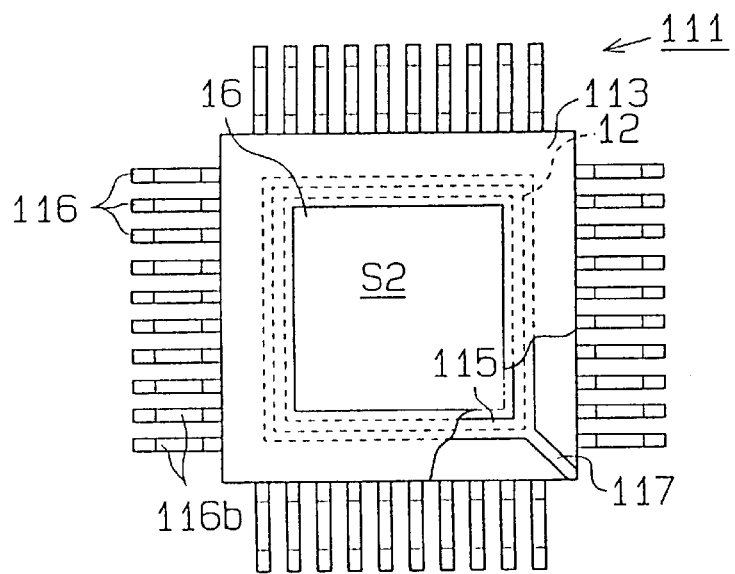
FIG. 23 is a partly cutaway plan view illustrating the semiconductor package of the seventh embodiment.
Figure 24D:
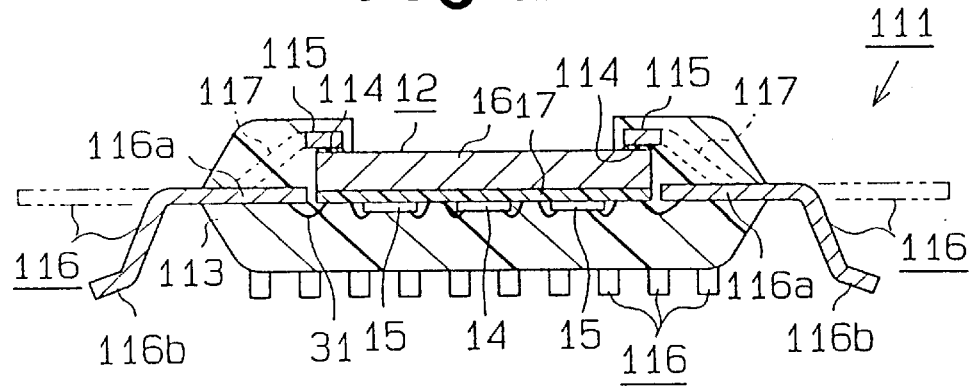
Figure 25:
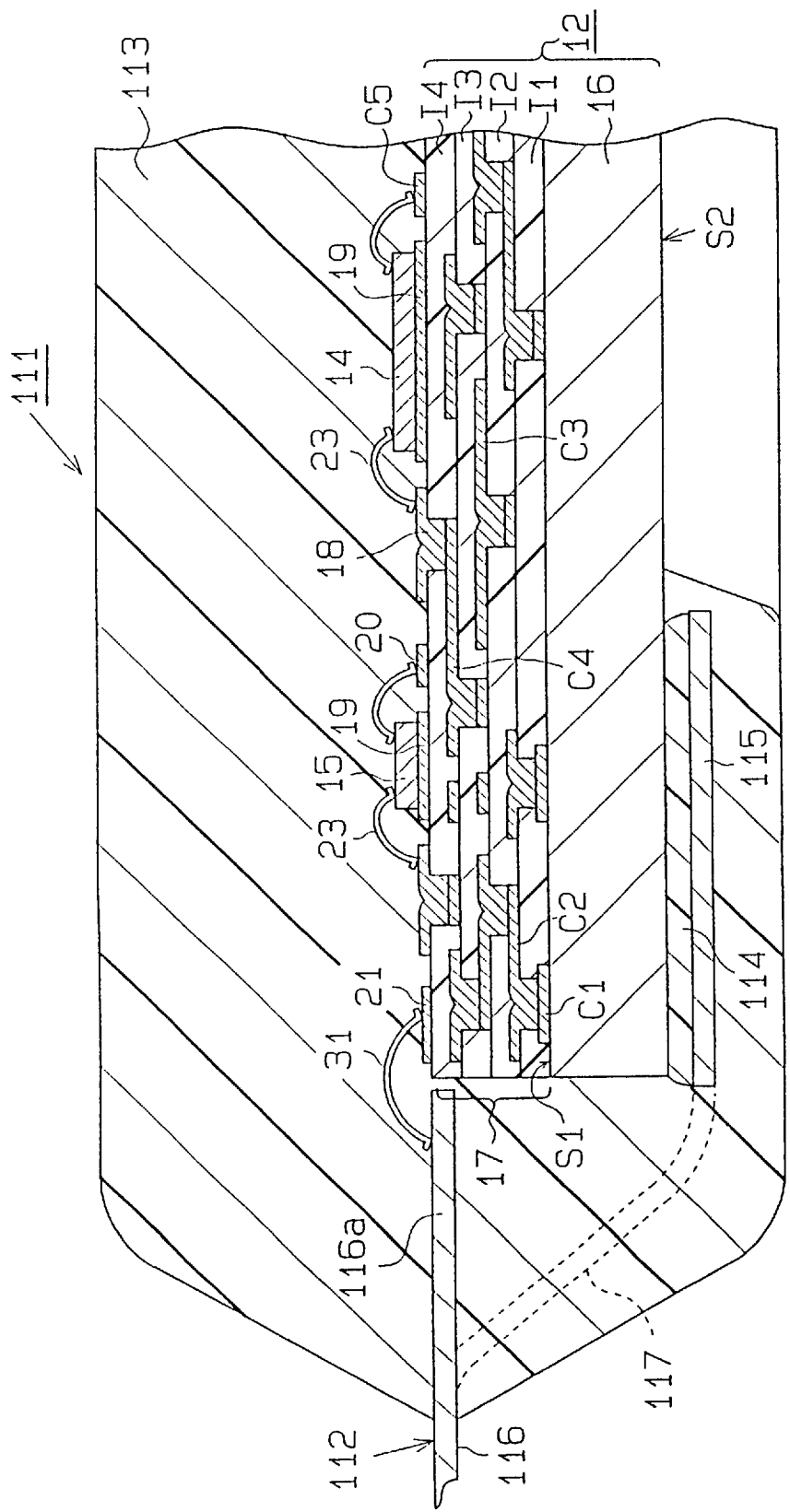
FIG. 25 is an enlarged sectional view illustrating a part of the semiconductor package shown in the FIG. 23.

As shown in FIG. 25, the semiconductor package 111 according to the embodiment consists of a lead frame 112 as a metal board, a wiring board 12 supported by the lead frame 112, a plurality of LSI chips 14 and 15 and molding resin 113 for sealing the electrical connecting parts. It is permissible to select one of the ML-PWBs 12 described in the first to fourth embodiment as a ML-PWB 12 in the embodiment. As shown in FIGS. 23 and 24D, the ML-PWB 12 is connected to an island 115 of the lead frame 112 via conductive adhesive 114. A plurality of lead wires 116 as I/O terminals are placed around the island 115 shaped like a window frame. Inner leads 116a of the leads 116 and I/O pads 22 on the ML-PWB 12 are connected via bonding wires 31. The ML-PWB 12 mounted on the lead frame 112 is transfer-molded using molding resin 113 with most of the second surface S2 of the substrate 16 exposed. Only outer leads 116b of the leads 116 are exposed with the molding resin 113. The outer leads 116b are bent so as to form shapes similar to gull-wings. The lead frame 112 before the trim and form process is shown in FIGS. 22A and 22B. One unit of the lead frame 112 consists of the island 115 shaped like a window frame, the leads 116 having the inner lead 116a and outer lead 116b, tie bars 117, a top rail 118, a bottom rail 119 and dam bars 120. A plurality of the units are aligned parallel to the top rail 118 and the bottom rail 119.

Each of the leads 116 is supported by the rails 118 and 119 with its inner lead 116a pointing to the island 115. The four tie bars 117 couple the four corners of the island 115 to the rails 118 and 119. The island 115 is supported by the rails 118 and 119 via the four tie bars 117. The spaces between each of the leads 116 are the same and fixed by the dam bars intersecting the leads 16 at the right angle.

As shown in FIG. 22B, the island 115 of the lead frame 112 projects from the level of the inner leads 116a. The difference of heights h2 of the levels of the island 115 and of the inner leads 116a has to be at least 0.5 mm, more preferably between 0.7 to 3.0 mm or most preferably between 1.0 to 2.0 mm. If the difference of heights h2 is too small, the distance from the inner leads 116a to the I/O pads 21 becomes greater and longer bonding wires 31 are required. This might make wire bonding impossible. In contrast, if the difference of heights is too great, forming the lead frame 112 might become difficult and the semiconductor package 111 might become thick. Considering these points, the difference of heights h2 is set at approximately 1.0 mm.

The semiconductor package 111 according to the embodiment is manufactured through the following process. No description of the manufacturing process of the ML-PWB 12, which was described in former embodiments, will be given.

The following is the manufacturing process of the lead frame 112. First, the island 115, leads 116 (including the inner leads 116a and the outer leads 116b), the tie bars 117, the top rail 118, bottom rail 119 and the dam bars 115 are formed on a flat metal board through etching or stamping. Next, the tie bars 117 are bent by a die to project the island 115 about 1 mm.

A metal board made of 0.1-mm-thick 42 alloy (Ni: 42, Fe: Re) is used as the material to form the lead frame 112 in the embodiment. An iron alloy like 50 alloy (Ni: 50, Fe: Re) or Kovar can be also used as the material to form the lead frame 112. These iron alloys are inexpensive and has a superior thermal characteristic. A copper alloy, which is easy to mold and has superior heat conductivity, can be used instead of an iron alloy. The number of the leads 16 is 212 and the pitch is 0.635 mm. The size of the island 115 is 35.2 mm by 35.2 mm.

Figure 24A:
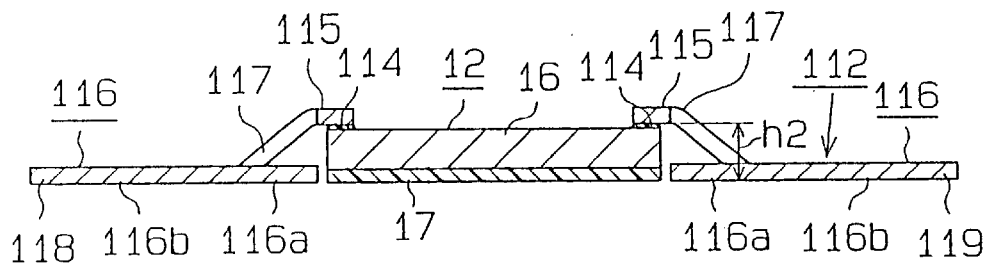
FIG. 24A, 24B, 24C and 24D are sectional views illustrating a sequence of steps for producing the semiconductor package shown in FIG. 23.
Figure 24B:
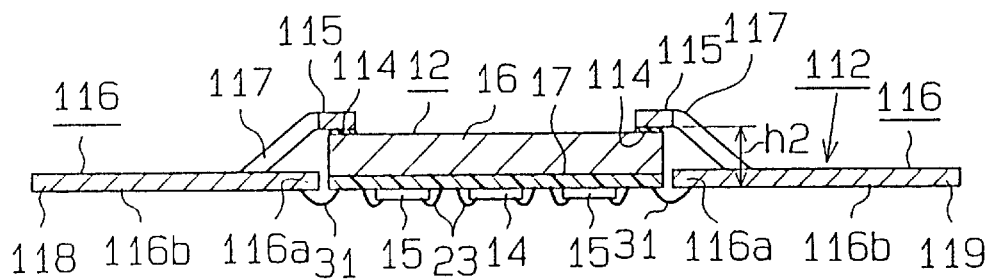
Figure 24C:
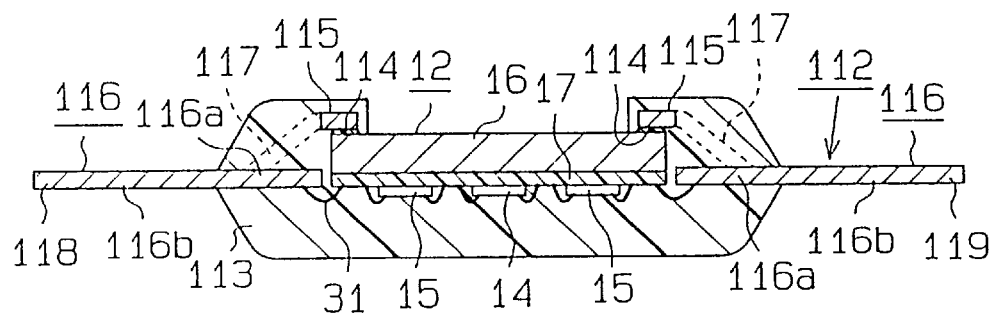

As shown in FIG. 24A, the wiring board 12, which has passed an open short defect test, is attached to the island 115 of the lead frame 112 with the conductive adhesive 114. Then, as shown in FIG. 24B, die bonding and wire bonding are performed on the wiring board 12. A function test is performed on the wiring board at this stage. The lead frame 112 with the wiring board 12 mounted thereon is placed in a molding die and is subjected to a transfer molding. A thermosetting resin, which is inexpensive, has good workability, and moisture resistance, is used as a molding resin 113.

After removing fins as necessary, the lead frame is subjected to trimming and forming process. In the trimming process, the needed part is cut off from the rails 118 and 119 by cutting the proximal end of the outer leads 116b and the tie bars 117 with the molding die. At the same time, the outer leads 116b are separated by cutting the dam bar 120. In the forming process, each of the outer leads is bent so as to form like gull-wings by another molding die. The above mentioned process manufactures a package 11 as shown in the FIGS. 24C and 24D.

The package 111 placed on the mother board (not shown) is subjected to a reflow soldering by one process so that it becomes fixed to the pad on the mother board. The heat dissipating area of the package 111 faces the mother board and the electronic parts mounting area faces the other side. The area exposed to the outside of the molding resin 113 is an effective area to dissipate the heat.

Most of the heat dissipating area formed on one surface of the wiring board 12 is exposed to the outside. Accordingly, the package 111 has a heat dissipating path across the board 12 in the direction of its thickness. Heat generated by the LI chips 14 and 15 reach the second side S2 of the substrate 16 through the heat dissipating path. Since the substrate 16 is made of a material having higher heat conductivity than resin material, the heat quickly propagates in the heat dissipating path. The heat is dissipated with high efficiency to the atmosphere from the second side S2. Since the island 115 of this embodiment is shaped like a window frame, the second side S2 of the substrate 16 is directly exposed to the atmosphere. Therefore a temperature increase of the LSI chips 14 and 15 is avoided and the heat dissipating efficiency of the package 111 is improved. Consequently the LSI chips 14 and 15 have much lower incidence of malfunction and breaking down due to the overheating, compared with the LSI chips mounted on conventional packages.

In this embodiment, the build-up layer 17 is formed only on the first side S1 of the substrate 16, while nothing in particular is formed on the second side S2. There is no need for forming plated through holes for conduction in the substrate 16. This requires no process of piercing the substrate 16. As a result, the manufacturing cost of the package 111 is reduced. Selecting epoxy resin as the molding resin 113 contributes to the reduction of the manufacturing cost of the package 111. Further reduction of the manufacturing cost is realized by selecting epoxy resin as a material for forming the interlayer insulation I1 to I4 of the build-up layer 17. Selecting a lead frame 112 made of a single metal board contributes to further cost reduction.

According to this embodiment, a plurality of LSI chips 14 and 15 can be mounted on a single wiring board 12. In contrast, conventional packages require heat slugs, the number of which matches the number of the LSI chips mounted thereon. Additionally, in order to fit the heat slugs into a substrate, chip-sized through holes must be formed at several locations in the substrate. This means that the design of the package 111 according to this embodiment is more preferable for simplifying the of manufacturing process than the conventional packages.

The island 115 of the lead frame 112 according to this embodiment projects about 1 mm from the level of the inner end of the inner leads 116a. This structure allows the top surface of the inner end of the inner leads 116a to be flush with the top surface of the connecting pads 21. Therefore, the bonding wires 31 can be shorter and the wire bonding becomes easier. This also facilitate the manufacturing process of the package 111.

The package 111 manufactured by the-above-mentioned process has a wide heat dissipating area of 60 to 80% with respect to the protected area of the package 111. Regardless of its wide heat dissipating area, the package 111 is about half the size of the conventional packages. In other words, the package design according to this embodiment achieves the downsizing of package as well as the improvement of heat dissipation characteristics.

The following are possible modifications of this embodiment.

Figure 26A:
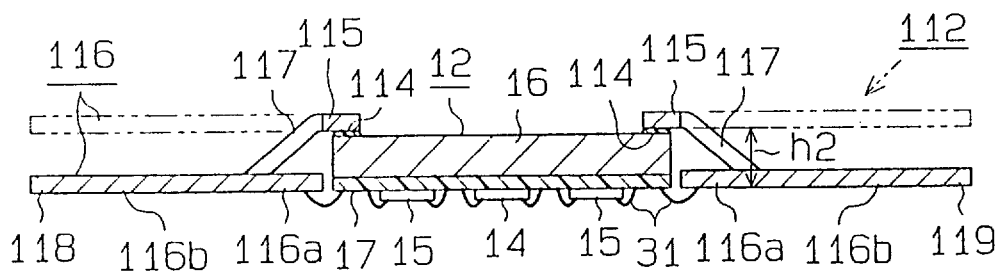
FIGS. 26A, 26B and 26C are sectional views illustrating another sequence of steps for producing the semiconductor package shown in FIG. 23.
Figure 26B:
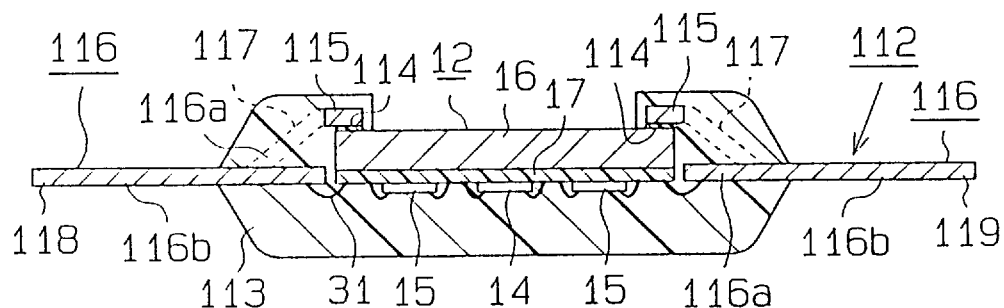
Figure 26C:
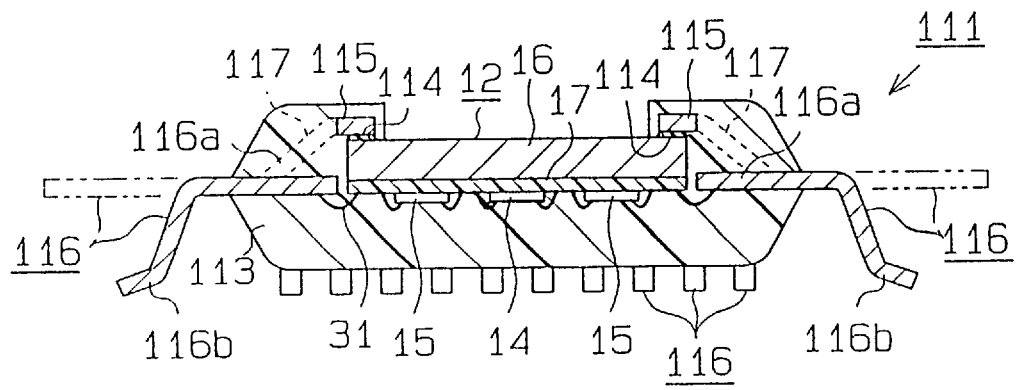
Figure 27:
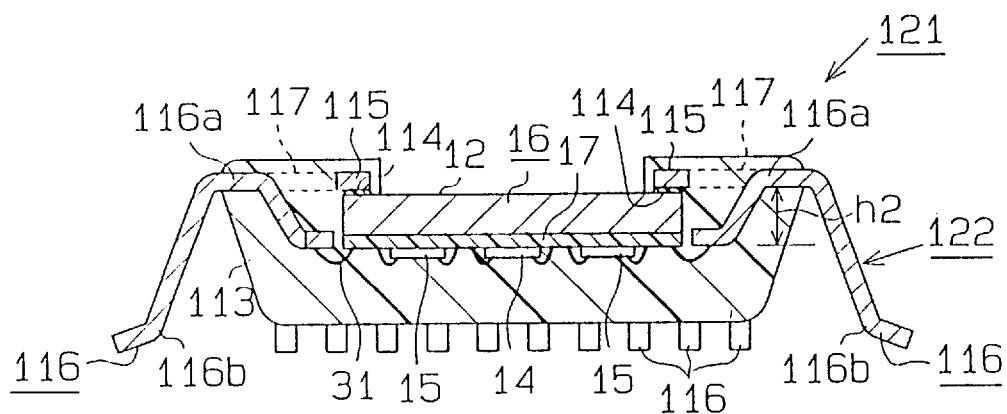
FIG. 27 shows a modification of the semiconductor package shown in FIG. 23.
Figure 28:
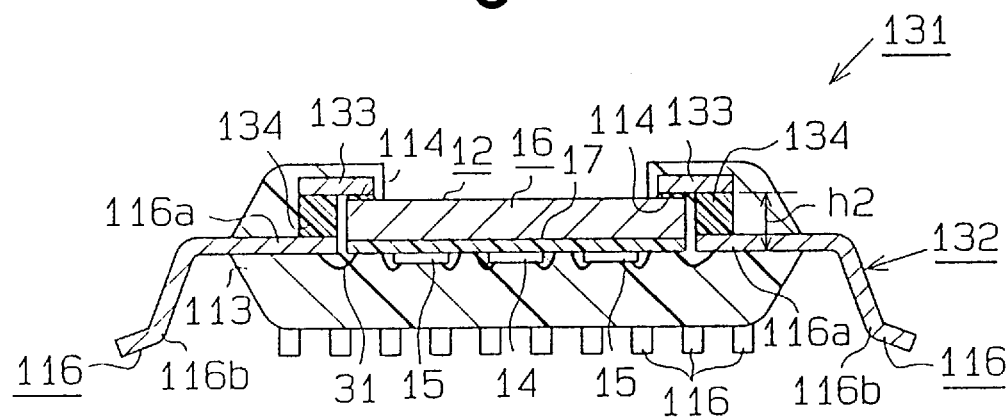
FIG. 28 shows a modification of the semiconductor package shown in FIG. 23.
Figure 29:
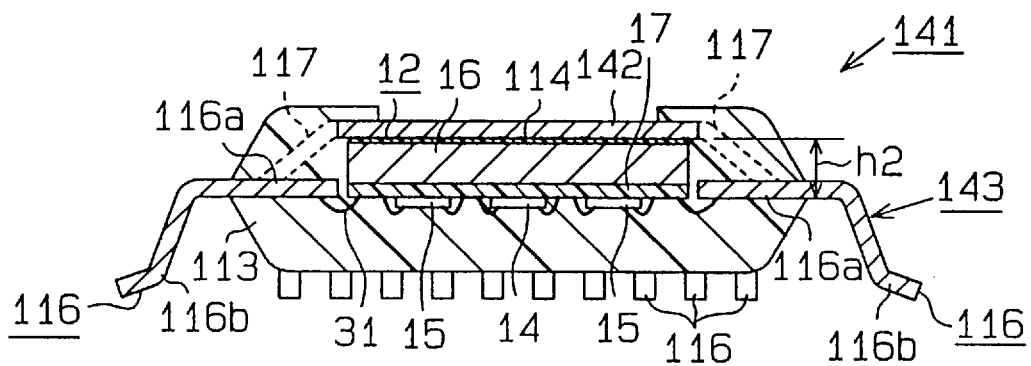
FIG. 29 shows a modification of the semiconductor package shown in FIG. 23.
Figure 30:
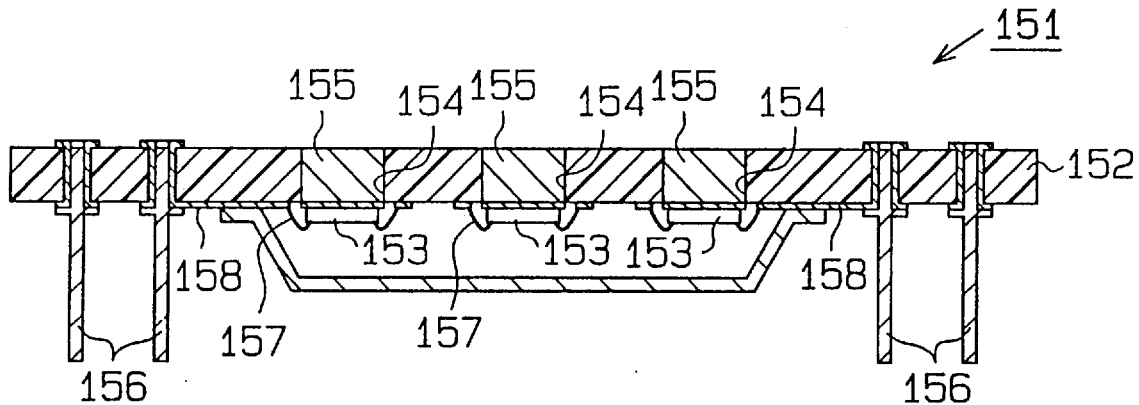
FIG. 30 is a sectional view illustrating a conventional plastic package equipped with heat slugs.

1. The package 111 can be manufactured by the following process. First, a wiring board 12, which has passed an open short defect test, and a lead frame 112 are required for this modification. The island 115 of the lead frame 112 does not have to project from the metal board. The island 115 is attached to the wiring board 12 with the adhesive 114. Being pushed by the pressure, the island 115 projects about 1 mm towards the direction of the second side S2 of the substrate 16 as shown in FIG. 26A. Then diebonding, wire bonding and transfer molding are performed on the package 111 as shown in FIG. 26B. After removing fins as necessary and processing the exterior, the lead frame is subjected to a trimming and forming process as shown in FIG. 26C. The advantage of this modification is that the island 115 projects and is attached to the wiring board 12 at the same time.

2. The outer lead 116b can be shaped not only like a gull-wing but also like the letter J, the letter I and the letter L.

3. In the package 121 in FIG. 27, the lead frame 122 can constitute a metal board with the inner leads projecting therefrom.

4. In the package 131 in FIG. 28, a multi-layered lead frame 132 can be used. An island 133 shaped like a window frame is attached to the inner leads 166 by the adhesive 134. This ensures a difference of the levels h2 between the inner ends of the inner lead 116a and the island 133.

5. In the package 141 in FIG. 29, a lead frame 143 may have an ordinary island 142 which is not shaped like a window frame.

6. There may be a plurality of islands 115 and the shape of the islands 115 does not have to be rectangular.

Therefore, the present examples and embodiments are to be considered as illustrative and not restrictive and the invention is not to be limited to the details given herein, but may be modified within the scope of the appended claims.

TABLE 1

|  | Substrate | Metal for Conductive Layer and its Thickness ($\mu$m) | | | | Interlayer Insulation ($\mu$m) |
|---|---|---|---|---|---|---|
|  |  | TF1 | TF2 | EP1 | L/S |  |
| Example 1 | Phosphor Bronze | Cr 0.1 | Cu 0.2 | E (Cu) 10 | 30/50 | 20 |
| Example 2 | Phosphor Bronze | Ti 0.1 | Cu 0.2 | E (Cu) 10 | 30/50 | 20 |
| Example 3 | Phosphor Bronze | Ni 0.1 | Cu 0.2 | E (Cu) 10 | 30/56 | 20 |
| Example 4 | Al$_2$O$_3$ | Cr 0.0 | Cu 0.2 | E (Cu) 5 | 15/20 | 10 |
| Example 5 | Al$_2$O$_3$ | Ti 0.1 | Cu 0.2 | E (Cu) 6 | 15/20 | 10 |
| Example 6 | Al$_2$O$_3$ | Ni 0.1 | Cu 0.2 | E (Cu) 6 | 15/20 | 10 |
| Example 7 | AlN | Cr 0.1 | Cu 0.2 | E (Cu) 1.5 | 4/6 | 5 |
| Example 8 | AlN | Ti 0.1 | Cu 0.2 | E (Cu) 1.5 | 4/6 | 5 |
| Example 9 | AlN | Ni 0.1 | Cu 0.2 | E (Cu) 1.5 | 4/6 | 5 |
| Example 10 | Phosphor Bronze | Ni 0.1 | — | E (Cu) 10 | 30/50 | 20 |
| Example 11 | Al$_2$O$_3$ | Cr 0.1 | Cu 0.2 | ED (Cu) 6 | 15/20 | 10 |
| Example 12 | FR-4 | — | — | ED (Cu) 30 | 75/75 | 55 |

E: Electroplating
ED: Electroless Deposition

TABLE 2

|  | Width of Conductive Layer | | Thickness of Inter Layer Insulation | | Pull Strength (kgf/mm$^2$) |
|---|---|---|---|---|---|
|  | Set Value | Measurement | Set Value | Measurement |  |
| Example 1 | 30 | 30.5 ± 1.0 $\mu$m | 20 | 20.0 ± 2.5 $\mu$m | >2.0 |
| Example 2 | 30 | 29.5 ± 1.5 | 20 | 20.2 ± 3.1 | >2.0 |
| Example 3 | 30 | 30.7 ± 1.4 | 20 | 20.3 ± 2.7 | >2.0 |
| Example 4 | 15 | 14.5 ± 1.5 | 10 | 10.0 ± 3.0 | >2.0 |
| Example 5 | 15 | 15.4 ± 1.2 | 10 | 9.8 ± 2.5 | >2.0 |
| Example 6 | 15 | 15.3 ± 1.3 | 10 | 10.4 ± 2.6 | >2.0 |
| Example 7 | 4 | 4.3 ± 1.1 | 5 | 5.2 ± 1.9 | >2.0 |
| Example 8 | 4 | 3.7 ± 0.8 | 5 | 5.1 ± 2.0 | >2.0 |
| Example 9 | 4 | 4.1 ± 0.9 | 5 | 4.9 ± 1.7 | >2.0 |
| Example 10 | 30 | 30.2 ± 1.5 | 20 | 19.8 ± 2.8 | >2.0 |
| Example 11 | 15 | 15.2 ± 1.3 | 10 | 10.2 ± 2.7 | >2.0 |
| Example 12 | 75 | 75.0 ± 5.0 | 55 | 55.0 ± 10.0 | 1.0 |

TABLE 3

|  | Metal for Conductive Layer and its Thickness ($\mu$m) | | | | Interlayer Insulation |
|---|---|---|---|---|---|
|  | TF1 | TF2 | EP1 | CV1 |  |
| Example 1 | Cr, 0.1 | Cu, 0.2 | E (Cu), 3.0 | E (Ni), 1.0 | EP |
| Example 2 | Cr, 0.1 | Cu, 0.5 | E (Cu), 5.0 | E (Ni), 1.0 | EP |
| Example 3 | Al, 0.1 | Ag, 0.2 | ED (Cu), 8.0 | ED (Ni), 2.0 | PI |
| Example 4 | Al, 0.1 | Cu, 0.2 | E (Cu), 5.0 | E (Cr), 1.0 | PI |
| Example 5 | W, 0.1 | Cu, 0.2 | ED (Cu), 5.0 | ED (Ni), 1.0 | EP |
| Example 6 | W, 0.1 | Cu, 0.5 | E (Cu), 15 | E (Cr), 2.0 | PI |

TABLE 3-continued

| | Metal for Conductive Layer and its Thickness (μm) | | | Interlayer |
|---|---|---|---|---|
| | TF1 | TF2 | EP1 | CV1 | Insulation |
| Example 7 | Cr, 0.1 | Cu, 0.2 | E (Cu), 5.0 | — | EP |

E: Electroplating
ED: Electroless Deposition

TABLE 4

| | Exfoliation when developed | Pull Strength (kgf/mm²) | Appearance of the Surface of Conductive Layer | Shape of Conductive Layer | Open Short Defect |
|---|---|---|---|---|---|
| Example 1 | none | 1.3 | good | good | none |
| Example 2 | none | 1.4 | good | good | none |
| Example 3 | none | 2.1 | good | good | none |
| Example 4 | none | 2.2 | good | good | none |
| Example 5 | none | 1.5 | good | good | none |
| Example 6 | none | 2.0 | good | good | none |

TABLE 5

| | TF2 | | | | | | |
|---|---|---|---|---|---|---|---|
| GD1 | Cu | Au | Ag | Pd | Pt | Ni | Fe |
| Cu | x, — | ○,A | ○,A | ○,A | ○,A | ○,D | ○,D |
| Cr | ○,B | ○,B | ○,B | ○,B | ○,B | ○,B | ○,— |
| Ni | x, — | ○,E | ○,E | ○,E | ○,E | x, — | x, — |
| Al | ○,B | ○,B | ○,B | ○,B | ○,B | ○,B | x, F |
| Sn | ○,B | ○,B | ○,B | ○,B | ○,B | ○,F | ○,F |
| Ti | ○,C | ○,C | ○,C | ○,C | ○,C | ○,C | x, — |
| Mo | ○,C | ○,C | ○,C | ○,C | ○,C | ○,C | x, — |
| Fe | ○,B | ○,B | ○,B | ○,B | ○,B | ○,B | x, — |

○: Combination Possible
x: Combination Impossible
A: H₂SO₄ + H₂O₂,
B: HCl,
C: HF,
D: CuCl₂ + NH₃,
E: FeCl₃ + HCl,
F: NaOH.

TABLE 6

| | Metal for Condcutive Layer and its Thickness (μm) | | | GD1 (μm) | Interlayer Insulation | Shape of Conductive Layer | Pull Strength (kgf/mm²) | Open Short Defect |
|---|---|---|---|---|---|---|---|---|
| | TF1 | TF2 | EP1 | | | | | |
| Example 1 | Cr, 0.1 | Cu, 0.2 | E (Cu) 8.0 | Cr, 0.2 | EP | good | 1.9 | none |
| Example 2 | Ti, 0.1 | Cu, 0.2 | E (Cu) 4.0 | Sn, 0.2 | PI | good | 2.5 | none |
| Example 3 | Ti, 0.1 | Cu, 0.2 | E (Cu) 4.0 | Al, 0.2 | EP | good | 2.4 | none |
| Example 4 | Cr, 0.1 | Pd, 0.2 | E (Cu) 4.0 | Fe, 0.3 | PI | good | 2.0 | none |
| Example 5 | Ni, 0.1 | Au, 0.1 | E (Cu) 4.0 | Cu, 0.2 | EP | good | 1.8 | none |
| Example 6 | Ni, 0.1 | Pt, 0.1 | E (Cu) 4.0 | Cu, 0.3 | PI | good | 1.7 | none |
| Example 7 | Mo, 0.1 | Ag, 0.1 | E (Cu) 4.0 | Cu, 0.2 | EP | good | 2.1 | none |
| Example 8 | Mo, 0.1 | Ni, 0.2 | E (Cu) 4.0 | Ti, 0.3 | PI | good | 2.0 | none |

E: Electroplating

We claim:

1. A multi-chip carrier assembly comprising:
a high density multi-layered printed wiring board including:
a substrate made of a material having a higher heat conductivity than that of resins;
a build-up layer formed on a first side of said substrate, said build-up layer being provided with interlayer insulations and conductive layers that are alternately laminated;
an electronic parts mounting area defined on a top surface of said build-up layer; and
a first plurality of I/O terminals provided, on the top surface of said build-up layer, at an area between said electronic parts mounting area and an edge of said substrate: and
a substrate supporter including:
a printed wiring board part consisting essentially of a resin material;
a window formed in said printed wiring board part and dimensioned for receipt of said high density multi-layered printed wiring board while a second side of said substrate, which is opposite to the first side of said substrate, is exposed from the window;
a plurality of bonding pads surrounding the window;
a second plurality of I/O terminals surrounding the group of said plurality of bonding pads; and
at least one conductive pattern for electrically connecting respective bonding pads and respective I/O terminals of said first plurality of I/O terminals.

2. A multi-chip carrier assembly according to claim 1, wherein each of said interlayer insulations is made of a photosensitive epoxy resin.

3. A multi-chip carrier assembly according to claim 1, wherein each of said conductive layers consists of a copper conductive layer and a groundwork layer placed between the copper conductive layer and one of said interlayer insulations, and wherein said groundwork layer includes a metal thin layer made of a metal selected from the group consisting of chrome, titanium and nickel.

4. A multi-chip carrier assembly according to claim 1, wherein each of said conductive layers has a copper conductive layer; wherein a metal cover layer is provided between a top surface of each copper conductive layer and a bottom surface of the interlayer insulation covering the copper conductive layer; and wherein said metal cover layer is made of a metal which improves adhesion between a copper conductive layer and an interlayer insulation associated with the copper conductive layer.

5. A multi-chip carrier assembly according to claim 4, wherein said cover layer is made of nickel.

6. A semiconductor package comprising:
a high density multi-layered printed wiring board including:
a substrate made of a material having a higher heat conductivity than that of resins;

a build-up layer formed on a first side of said substrate, said build-up layer being provided with interlayer insulations and conductive layers that are alternately laminated;

an electronic parts mounting area defined on a top surface of said build-up layer; and a first plurality of I/O terminals provided, on the top surface of said build-up layer, at an area between said electronic parts mounting area and an edge of said substrate; a plurality of electronic parts mounted on the electronic parts mounting area provided on said build-up layer of said high density multi-layered printed wiring board; and a substrate supporter including:
a printed wiring board part consisting essentially of a resin material;
a window formed in said printed wiring board part and dimensioned for receipt of said high density multi-layered printed wiring board while a second side of said substrate, which is opposite to the first side of said substrate, is exposed from the window;
a plurality of bonding pads surrounding the window;
a second plurality of I/O terminals surrounding the group of said plurality of bonding pads; and
at least one conductive pattern for electrically connecting respective bonding pads and respective I/O terminals of said first plurality of and terminals, and
wherein the I/O terminals of said first plurality of I/O terminals of said build-up layer are electrically connected to the bonding pads on said substrate supporter.

7. A semiconductor package according to claim 6 wherein,
each of said interlayer insulations is made of a photosensitive epoxy resin.

8. A semiconductor package according to claim 6 wherein,
each of said conductive layers consists of a copper conductive layer and a groundwork layer placed between the copper conductive layer and one of said interlayer insulations, and wherein said groundwork layer includes a metal thin layer made of a metal selected from the group consisting of chrome, titanium and nickel.

9. A semiconductor package according to claim 6 wherein,
each of said conductive layers has a copper conductive layer; wherein a metal cover layer is provided between a top surface of each copper conductive layer and a bottom surface of the interlayer insulation covering the copper conductive layer; and wherein said metal cover layer is made of a metal which improves adhesion between a copper conductive layer and an interlayer insulation associated with the copper conductive layer.

10. A semiconductor package according to claim 9 wherein,
said cover layer is made of nickel.

11. A semiconductor package comprising:
a high density multi-layered printed wiring board including:
a substrate made of a material having a higher heat conductivity than that of resins;
a build-up layer formed on a first side of said substrate, said build-up layer being provided with interlayer insulations and conductive layers that are alternately laminated;
an electronic parts mounting area defined on a top surface of said build-up layer; and a first plurality of I/O terminals provided, on the top surface of said build-up layer, at an area between said electronic parts mounting area and an edge of said substrate; a plurality of electronic parts mounted on the electronic parts mounting area provided on said build-up layer of said high density multi-layered printed wiring board;

a lead frame provided with a plurality of leads surrounding an island supporting said high density multi-layered printed wiring board, said leads being electrically connected to the I/O terminals of said first plurality on said build-up layer; and a resin molding for sealing electrical connections with a second side of said substrate exposed.

12. A semiconductor package according to claim 11 wherein,
each of said interlayer insulations is made of a photosensitive epoxy resin.

13. A semiconductor package according to claim 11 wherein,
each of said conductive layers consists of a copper conductive layer and a groundwork layer placed between the copper conductive layer and one of said interlayer insulations, and wherein said groundwork layer includes a metal thin layer made of a metal selected from the group consisting of chrome, titanium and nickel.

14. A semiconductor package according to claim 11 wherein, each of said conductive layers has a copper conductive layer; wherein a metal cover layer is provided between a top surface of each copper conductive layer and a bottom surface of the interlayer insulation covering the copper conductive layer; and wherein said metal cover layer is made of a metal which improves adhesion between a copper conductive layer and an interlayer insulation associated with the copper conductive layer.

15. A semiconductor package according to claim 14 wherein,
said cover layer is made of nickel.

16. A high density multi-layered printed wiring board comprising:
substrate having a higher heat conductivity than that of resins;
a build-up layer formed on a first side of said substrate and having interlayer insulations and conductive layers that are alternately laminateed;
an electronic parts mounting area defined on a top surface of said build-up layer;
a first plurality of I/O terminals provided on the top surface of said build-up layer;
a substrate supporter for mounting the multi-layered printed wiring board thereon and defining a window portion formed and dimensioned for supportive receipt of said high density multi-layered printed wiring board therein in a manner such that an opposite second side of said substrate is substantially exposed from the window, said substrate supporter including a second plurality of I/O terminals being electrically connected to said first plurality of I/O terminals.

17. The high density multi-layered printed wiring board as defined in claim 16 wherein, said first plurality of 110 terminals are positioned between said electronic parts mounting area and an edge of said substrate.

18. A high density multi-layered printed wiring board comprising:

a substrate having a higher heat conductivity than that of resins;

a build-up layer formed on a first side of said substrate and having interlayer insulations and conductive layers that are alternately laminated;

an electronic parts mounting area defined on a top surface of said build-up layer;

a first plurality of I/O terminals provided on the top surface of said build-up layer;

a lead frame including a plurality of leads, at least one of which being electrically connected to a respective I/O terminal of said first plurality of I/O terminals, and having an island member adapted to support the substrate thereon in a manner such that an opposite second side of said substrate is substantially exposed when mounted to said island member.

19. The high density multi-layered printed wiring board as defined in claim 18 further including:

a resin molding configured to seal electrical connections with a second side of the substrate while maintaining said substantial exposure thereof.

20. The high density multi-layered printed wiring board as defined in claim 18 wherein, said island member defining a window portion enabling said substantial exposure of said second side of said substrate.

21. The high density multi-layered printed wiring board as defined in claim 20 wherein, said lead frame defines an opening therethrough formed and dimensioned for receipt of the suspended substrate or said build-up layer therein.

22. The high density multi-layered printed wiring board as defined in claim 21 wherein, said plurality of I/O terminals of said build-up layer are positioned between said electronic parts mounting area and an edge of said substrate.

23. The high density multi-layered printed wiring board as defined in claim 22 wherein, said plurality of leads are positioned around said island member.

* * * * *